United States Patent
Kang et al.

(10) Patent No.: US 11,817,170 B2
(45) Date of Patent: Nov. 14, 2023

(54) STORAGE CONTROLLER DETERMINING ERROR COUNT, METHOD OF OPERATING THE SAME, AND METHOD OF OPERATING STORAGE DEVICE INCLUDING THE SAME

(71) Applicant: SAMSUNG ELECTRONICS CO., LTD., Suwon-si (KR)

(72) Inventors: Woohyun Kang, Hwaseong-si (KR); Youngdeok Seo, Seoul (KR); Hyuna Kim, Suwon-si (KR); Hyunkyo Oh, Yongin-si (KR); Heewon Lee, Seoul (KR); Donghoo Lim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 22 days.

(21) Appl. No.: 17/723,959

(22) Filed: Apr. 19, 2022

(65) Prior Publication Data
US 2023/0103694 A1 Apr. 6, 2023

(30) Foreign Application Priority Data
Oct. 1, 2021 (KR) .................. 10-2021-0131025

(51) Int. Cl.
*G11C 29/00* (2006.01)
*G11C 29/50* (2006.01)

(52) U.S. Cl.
CPC .......... *G11C 29/50004* (2013.01); *G11C 2029/5004* (2013.01)

(58) Field of Classification Search
CPC .............. G11C 29/50004; G11C 2029/5004
See application file for complete search history.

(56) References Cited

U.S. PATENT DOCUMENTS

| 7,486,561 B2 | 2/2009 | Mokhlesi |
| 9,613,711 B2 | 4/2017 | Kim et al. |
| 9,690,654 B2 | 6/2017 | No et al. |

(Continued)

FOREIGN PATENT DOCUMENTS

| KR | 20180042792 A | 4/2018 |
| KR | 20180083689 A | 7/2018 |

(Continued)

OTHER PUBLICATIONS

Kim et al. "A 512-Gb 3-b/Cell 64 Stacked . . . " IEEE Journal of Solid State Circuits, vol. 53, No. 1, Jan. 2018.

*Primary Examiner* — Christine T. Tu
(74) *Attorney, Agent, or Firm* — Lee IP Law, P.C.

(57) ABSTRACT

Disclosed is a method of operating a storage controller which communicates with a non-volatile memory device. The method includes outputting a first command including a request for on-chip valley search (OVS) count data of a memory region of the non-volatile memory device to the non-volatile memory device, wherein the OVS count data include a first count value of a first read voltage and a second count value of a second read voltage, receiving the OVS count data from the non-volatile memory device, determining a first error count value for the first read voltage and a second error count value for the second read voltage, based on the OVS count data, and determining a subsequent operation, based on the first and second error count values.

20 Claims, 20 Drawing Sheets

(56) References Cited

U.S. PATENT DOCUMENTS

| | | | |
|---|---|---|---|
| 9,921,908 B2 | 3/2018 | Yum et al. |
| 10,140,040 B1 | 11/2018 | Koudele et al. |
| 10,163,518 B2 | 12/2018 | Yoon et al. |
| 10,216,422 B2 | 2/2019 | Kim et al. |
| 10,424,388 B2 | 9/2019 | Oh et al. |
| 10,559,362 B2 | 2/2020 | Shin et al. |
| 10,573,389 B2 | 2/2020 | Kim et al. |
| 10,606,710 B2 | 3/2020 | Kim |
| 10,802,728 B2 | 10/2020 | Lee et al. |
| 10,937,508 B2 | 3/2021 | Kim et al. |
| 11,003,383 B2 | 5/2021 | Sheperek et al. |
| 11,189,358 B2 | 11/2021 | Choi et al. |
| 11,430,523 B2 | 8/2022 | Hong et al. |
| 2014/0119124 A1 | 5/2014 | Kim et al. |
| 2018/0204624 A1 | 7/2018 | Yoon et al. |
| 2020/0159464 A1* | 5/2020 | Park ................ H03M 13/1111 |
| 2020/0387313 A1 | 12/2020 | Lee et al. |
| 2020/0409581 A1 | 12/2020 | Oh et al. |
| 2021/0020226 A1 | 1/2021 | Lim et al. |
| 2021/0263647 A1* | 8/2021 | You ....................... G06F 3/061 |
| 2022/0043606 A1* | 2/2022 | Lee ..................... G06F 3/0659 |

FOREIGN PATENT DOCUMENTS

| | | | |
|---|---|---|---|
| KR | 10-2018-0110473 A | 10/2018 |
| KR | 20190043022 A | 4/2019 |
| KR | 20190084779 A | 7/2019 |
| KR | 20190096653 A | 8/2019 |
| KR | 10-2020-0034123 A | 3/2020 |
| KR | 20200139044 A | 12/2020 |
| KR | 10-2233074 B1 | 3/2021 |
| KR | 20210082875 A | 7/2021 |
| KR | 20210100265 A | 8/2021 |

\* cited by examiner

FIG. 4
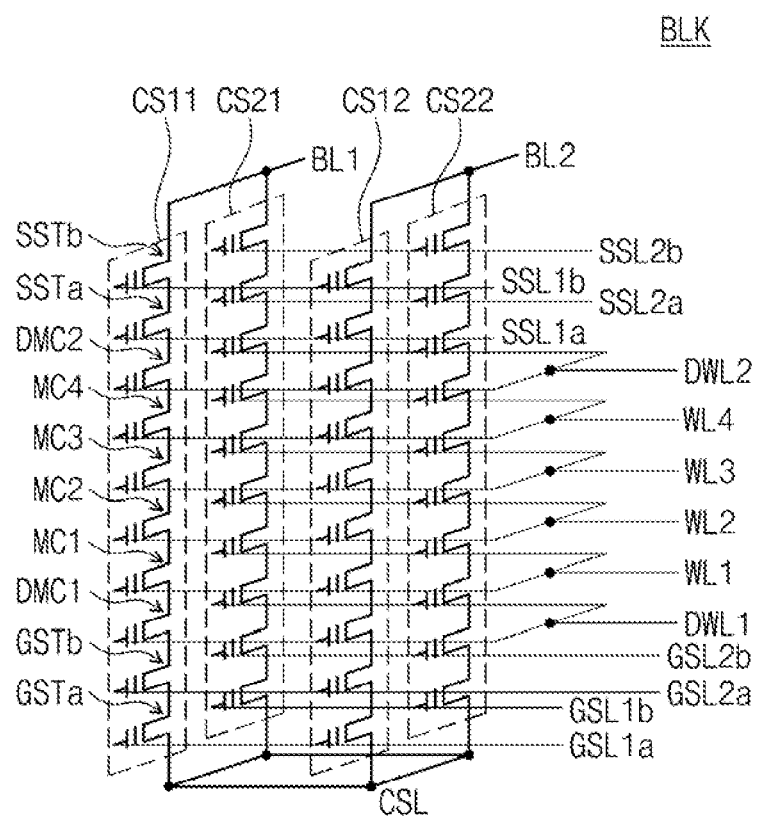
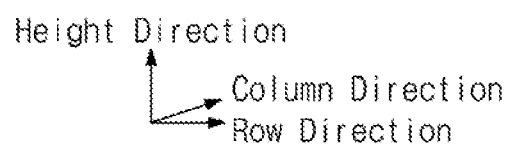

FIG. 9

<Distribution Type Table>

| Index | Type | Description |
|---|---|---|
| 1 | Normal | Memory cells are programmed normally |
| 2 | Retention | Threshold voltages are lowered as time elapsed |
| 3 | Read Disturb | According to a read operation of the adjacent word line, a threshold voltage distribution changes |
| 4 | Pre-programming | Among pre-programming and post-programming of QLC, only the pre-programming is performed |
| 5 | One-shot | One-shot programming is performed |
| 6 | HCI | A threshold voltage distribution is increased by a hot carrier injection |
| 7 | NCW | Threshold voltage distributions are generally low, because adjacent word lines are not programmed (No-coupled word line) |
| 8 | SPO | By Sudden power off, programming is abnormally performed |
| 9 | Erase | Memory cells are not yet programmed |

STORAGE CONTROLLER DETERMINING ERROR COUNT, METHOD OF OPERATING THE SAME, AND METHOD OF OPERATING STORAGE DEVICE INCLUDING THE SAME

CROSS-REFERENCE TO RELATED APPLICATION

This application claims priority under 35 U.S.C. § 119 to Korean Patent Application No. 10-2021-0131025 filed on Oct. 1, 2021, in the Korean Intellectual Property Office, the disclosure of which is incorporated by reference herein in its entirety.

BACKGROUND

1. Field

Embodiments relate to a storage device, and more particularly, relate to a storage controller determining an error count used to determine whether to perform read reclaim, a method of operating the same, and a method of operating a storage device including the same.

2. Description of the Related Art

A memory device stores data in response to a write request and outputs data stored therein in response to a read request. A memory device may be classified as a volatile memory device, which loses data stored therein when a power supply is turned off, such as a dynamic random access memory (DRAM) device or a static RAM (SRAM) device, or a non-volatile memory device, which retains data stored therein even when a power supply is turned off, such as a flash memory device, a phase-change RAM (PRAM), a magnetic RAM (MRAM), or a resistive RAM (RRAM).

SUMMARY

According to an embodiment, a method of operating a storage controller which communicates with a non-volatile memory device includes outputting a first command including a request for on-chip valley search (OVS) count data of a memory region of the non-volatile memory device to the non-volatile memory device, wherein the OVS count data include a first count value of a first read voltage and a second count value of a second read voltage, receiving the OVS count data from the non-volatile memory device, determining a first error count value for the first read voltage and a second error count value for the second read voltage, based on the OVS count data, and determining a subsequent operation, based on the first and second error count values.

According to an embodiment, a method of operating a storage device which includes a non-volatile memory device and a storage controller includes providing, by the storage controller, a first command including an on-chip valley search (OVS) read request for a memory region of the non-volatile memory device to the non-volatile memory device, generating, by the non-volatile memory device, OVS count data of the memory region based on the first command, providing, by the storage controller, a second command including a request for the OVS count data to the non-volatile memory device, providing, by the non-volatile memory device, the OVS count data to the storage controller based on the second command, generating, by the storage controller, error count data of the memory region based on the OVS count data, determining whether a read reclaim condition of the memory region is satisfied, based on the error count data, and outputting a third command including a read reclaim request of the memory region to the non-volatile memory device when it is determined that the read reclaim condition is satisfied.

According to an embodiment, a storage controller includes an on-chip valley search (OVS) management module that manages an OVS read operation of a memory region of a non-volatile memory device, a command generator that generates a first command including an OVS read request and a second command including a request for OVS count data, under control of the OVS management module, an error predictor that generates error count data of the memory region based on the OVS count data received as a response of the second command from the non-volatile memory device, and a read reclaim module that determines whether a read reclaim condition of the memory region is satisfied, based on the error count data. When it is determined that the read reclaim condition is satisfied, the read reclaim module generates a read reclaim request of the memory region. The command generator generates a third command including the read reclaim request, under control of the read reclaim module.

BRIEF DESCRIPTION OF THE FIGURES

Features will become apparent to those of skill in the art by describing in detail example embodiments with reference to the attached drawings in which:

FIG. 4 is a diagram describing a memory block of a memory cell array of FIG. 3, according to some example embodiments.

FIG. 9 is a diagram describing a distribution type table according to some example embodiments.

DETAILED DESCRIPTION

Figure 1:
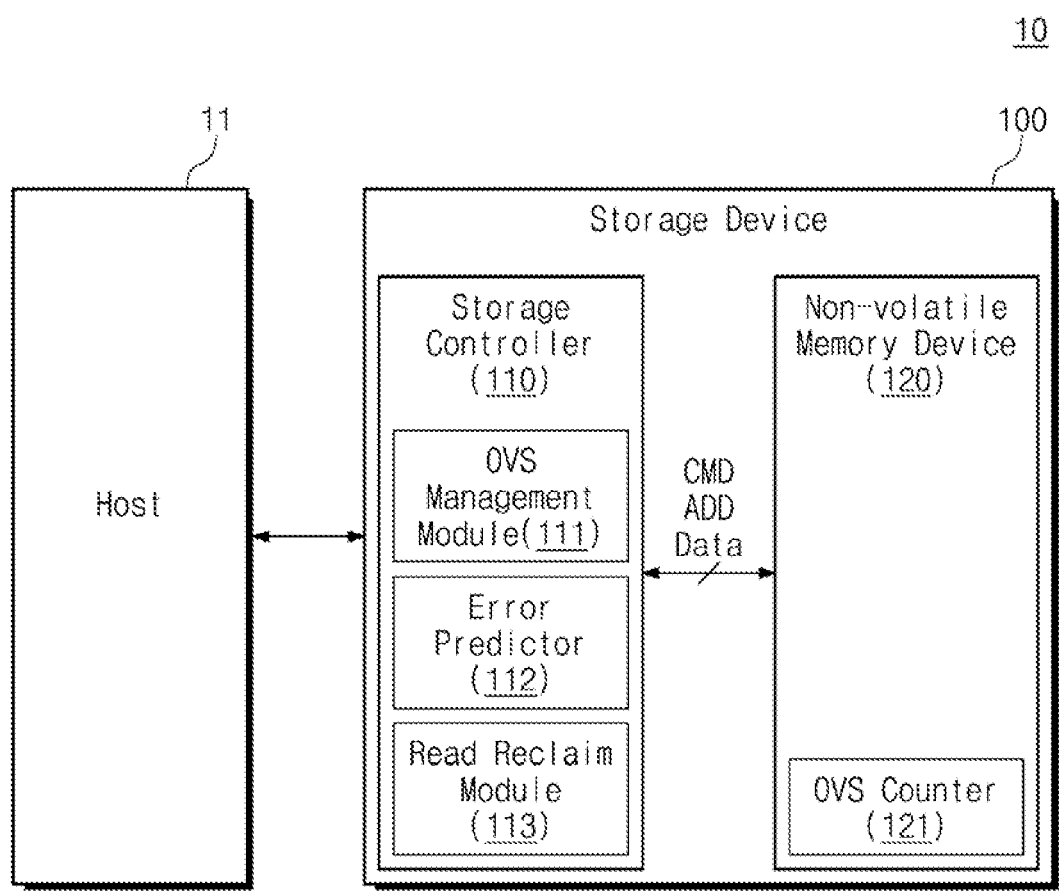
FIG. 1 is a block diagram of a storage system according to an example embodiment.

FIG. 1 is a block diagram of a storage system according to an example embodiment.

Referring to FIG. 1, a storage system 10 may include a host 11 and a storage device 100. The storage system 10 may be a computing system, which is configured to process a variety of information, such as a personal computer (PC), a notebook, a laptop, a server, a workstation, a tablet PC, a smartphone, a digital camera, and a black box.

The host 11 may control an overall operation of the storage system 10. For example, the host 11 may store data in the storage device 100 or may read data stored in the storage device 100.

The storage device 100 may include a storage controller 110 and a non-volatile memory device 120. The non-volatile memory device 120 may store data. The storage controller 110 may store data in the non-volatile memory device 120, or may read data stored in the non-volatile memory device 120. The non-volatile memory device 120 may operate under control of the storage controller 110. For example, based on a command CMD indicating an operation and an address ADD indicating a location of data, the storage controller 110 may store the data in the non-volatile memory device 120, or may read the data stored in the non-volatile memory device 120.

The non-volatile memory device 120 may be a NAND flash memory device, or the non-volatile memory device 120 may be one of various storage devices, which retain data stored therein even though a power is turned off, such as a phase-change random access memory (PRAM), a magnetic random access memory (MRAM), a resistive random access memory (RRAM), and a ferroelectric random access memory (FRAM).

The storage controller 110 may include an on-chip valley search (OVS) management module 111, an error predictor 112, and a read reclaim module 113.

The OVS management module 111 may control an OVS read operation of a memory region by the non-volatile memory device 120. The memory region may correspond to a set of a plurality of memory cells, such as a memory channel, a memory chip, a memory plane, or a memory block in the non-volatile memory device 120.

An OVS read operation may be performed by the non-volatile memory device 120, not the storage controller 110. The OVS read operation may refer to an operation of counting the number of memory cells included in a valley search section (e.g., a section including a voltage level section lower than an optimized read voltage and a voltage level section higher than the optimized read voltage) every read voltage, together with a normal read operation of reading data stored in the non-volatile memory device 120. The OVS read operation will be described in detail with reference to FIG. 6.

The OVS management module 111 may control an OVS counter 121 of the non-volatile memory device 120. For example, the OVS management module 111 may provide an OVS read request to the non-volatile memory device 120, and the OVS counter 121 of the non-volatile memory device 120 may generate OVS count data corresponding to the OVS read operation. The OVS count data may include OVS count values respectively corresponding to different read voltages. The non-volatile memory device 120 may provide the OVS count data to the storage controller 110 depending on a request of the OVS management module 111.

The error predictor 112 may generate error count data of the memory region, based on the OVS count data received from the non-volatile memory device 120. The error count data may include error count values respectively corresponding to the different read voltages. An error count value may indicate the number of memory cells having an error (e.g., memory cells in which programming states change).

An error count value may be a value predicted by the error predictor 112. For example, the error predictor 112 may train for a correspondence relationship between an OVS count value and an error count value, based on a plurality of pairs of an OVS count value and an error count value, for each read voltage, and the error predictor 112 may predict an error count value, based on the trained correspondence relationship and the OVS count value. An operation of predicting an error count value based on an OVS count value will be described in detail with reference to FIGS. 6, 7, 8A, 8B, and 8C.

The error predictor 112 may generate the error count data by using a machine learning device. For example, the machine learning device may train for a relationship between the OVS count data and the error count data, and the machine learning device may determine the error count data corresponding to the OVS count data, based on the trained relationship. The machine learning device will be described in detail with reference to FIGS. 14 and 15.

The read reclaim module 113 may receive the error count data from the error predictor 112. The read reclaim module 113 may determine whether to perform the read reclaim operation on a memory region of the non-volatile memory device 120, based on the error count data. The read reclaim operation may refer to an operation of copying data of a degraded memory region to another memory region for the purpose of maintaining the reliability of data. However, because the read reclaim increases a latency and an input/output (I/O) load, whether or not to perform the read reclaim operation should be carefully determined.

The read reclaim module 113 may use error count data of a read voltage unit (e.g., in which whether a bit value of a memory cell is flipped is determined for each read voltage), not error count data of a page unit (e.g., in which a bit value of a memory cell is determined to be "1" or "0" based on all read voltages of the same logical page). Accordingly, even though a memory region is degraded by compound factors or an abnormal factor, it may be possible to accurately determine whether the read reclaim is required.

The read reclaim module 113 may determine whether to perform the read reclaim based on distribution type information of a memory region. For example, even if it is determined that a read reclaim condition is satisfied based on error count data, the read reclaim module 113 may not perform the read reclaim when a distribution type of the memory region corresponds to an exceptional distribution type (e.g., a pre-programming type). The read reclaim operation based on a distribution type will be described in detail with reference to FIG. 13.

The non-volatile memory device 120 may include the OVS counter 121. The OVS counter 121 may generate the OVS count data corresponding to the OVS read operation under control of the OVS management module 111. For example, the OVS counter 121 may generate the OVS count data based on a command including the OVS read request.

As described above, the non-volatile memory device 120 may generate the OVS count data by performing the OVS read operation. Because the non-volatile memory device 120 generates the OVS count data as a by-product of the normal read operation, the storage controller 110 may obtain distribution information (e.g., the OVS count data) without an additional read request or count operation. As such, an input/output (I/O) load and a latency of the storage device 100, which are associated with obtaining the distribution information, may decrease.

Also, because the storage controller 110 uses an error count value of a read voltage unit, not an error count value of a page unit, the storage controller 110 may accurately determine whether the read reclaim is called for. Accordingly, the storage device 100 may be provided in which the reliability of data is improved and a latency and an I/O load decrease.

Figure 2:
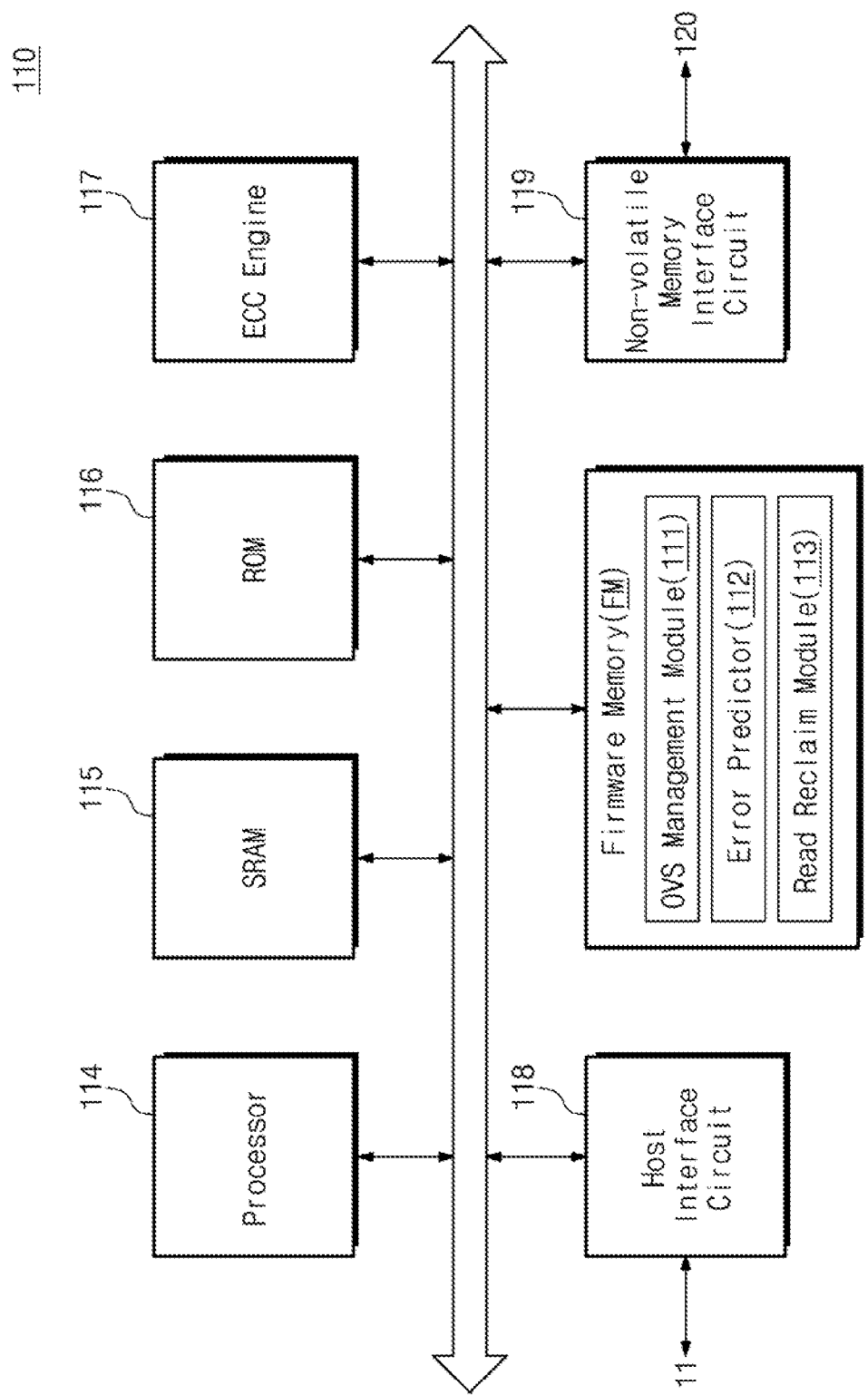
FIG. 2 is a block diagram illustrating a storage controller of FIG. 1 in detail, according to some example embodiments.

FIG. 2 is a block diagram illustrating a storage controller of FIG. 1 in detail, according to some example embodiments.

Referring to FIGS. 1 and 2, the storage controller 110 may communicate with the host 11 and the non-volatile memory device 120. The storage controller 110 may include the OVS management module 111, the error predictor 112, the read reclaim module 113, a processor 114, a static random access memory (SRAM) 115, a read only memory (ROM) 116, an error correction code (ECC) engine 117, a host interface circuit 118, and a non-volatile memory interface circuit 119. The OVS management module 111, the error predictor 112, and the read reclaim module 113 are similar to the OVS management module 111, the error predictor 112, and the read reclaim module 113 of FIG. 1, and thus, additional description will be omitted to avoid redundancy.

The storage controller 110 may include a firmware memory FM, which may store a variety of information used for the storage controller 110 to operate, in the form of instructions. For example, the OVS management module 111, the error predictor 112, and the read reclaim module 113 may be implemented by software, and the instructions stored in the firmware memory FM may execute or implement the OVS management module 111, the error predictor 112, and the read reclaim module 113. In another implementation, the OVS management module 111, the error predictor 112, and the read reclaim module 113 may be implemented with a separate hardware device.

The processor 114 may control an overall operation of the storage controller 110.

The SRAM 115 may be used as a buffer memory, a cache memory, or a working memory of the storage controller 110.

The ROM 116 may be used as a read only memory storing information used for the operation of the storage controller 110.

The ECC engine 117 may detect and correct an error of data read from the non-volatile memory device 120. For example, the ECC engine 117 may have an error correction capability of a given level. The ECC engine 117 may process data having an error level (e.g., the number of flipped bits) exceeding the error correction capability as an uncorrectable error.

The ECC engine 117 may generate real error count data based on the error correction. For example, the error predictor 112 may predict error count data from OVS count data based on the pre-trained correspondence relationship, whereas, in contrast, the ECC engine 117 may perform error correction on read data and may generate real error count data based on the number of memory cells in which an error is actually corrected. The read reclaim module 113 may determine whether to perform the read reclaim operation, based on the real error count data from the ECC engine 117 and the error count data from the error predictor 112. This will be described in detail with reference to FIG. 12.

The storage controller 110 may communicate with the host 11 through the host interface circuit 118. The host interface circuit 118 may be implemented based on at least one of various interfaces such as a serial ATA (SATA) interface, a peripheral component interconnect express (PCIe) interface, a serial attached SCSI (SAS), a nonvolatile memory express (NVMe) interface, and a universal flash storage (UFS) interface.

The storage controller 110 may communicate with the non-volatile memory device 120 through the non-volatile memory interface circuit 119. The non-volatile memory interface circuit 119 may be implemented based on a NAND interface.

The storage controller 110 may output a command including the OVS read request, a command including a request for the OVS count data, or a command including a read reclaim request, to the non-volatile memory device 120 through the non-volatile memory interface circuit 119. The storage controller 110 may receive read data and OVS count data from the non-volatile memory device 120 through the non-volatile memory interface circuit 119.

Figure 3:
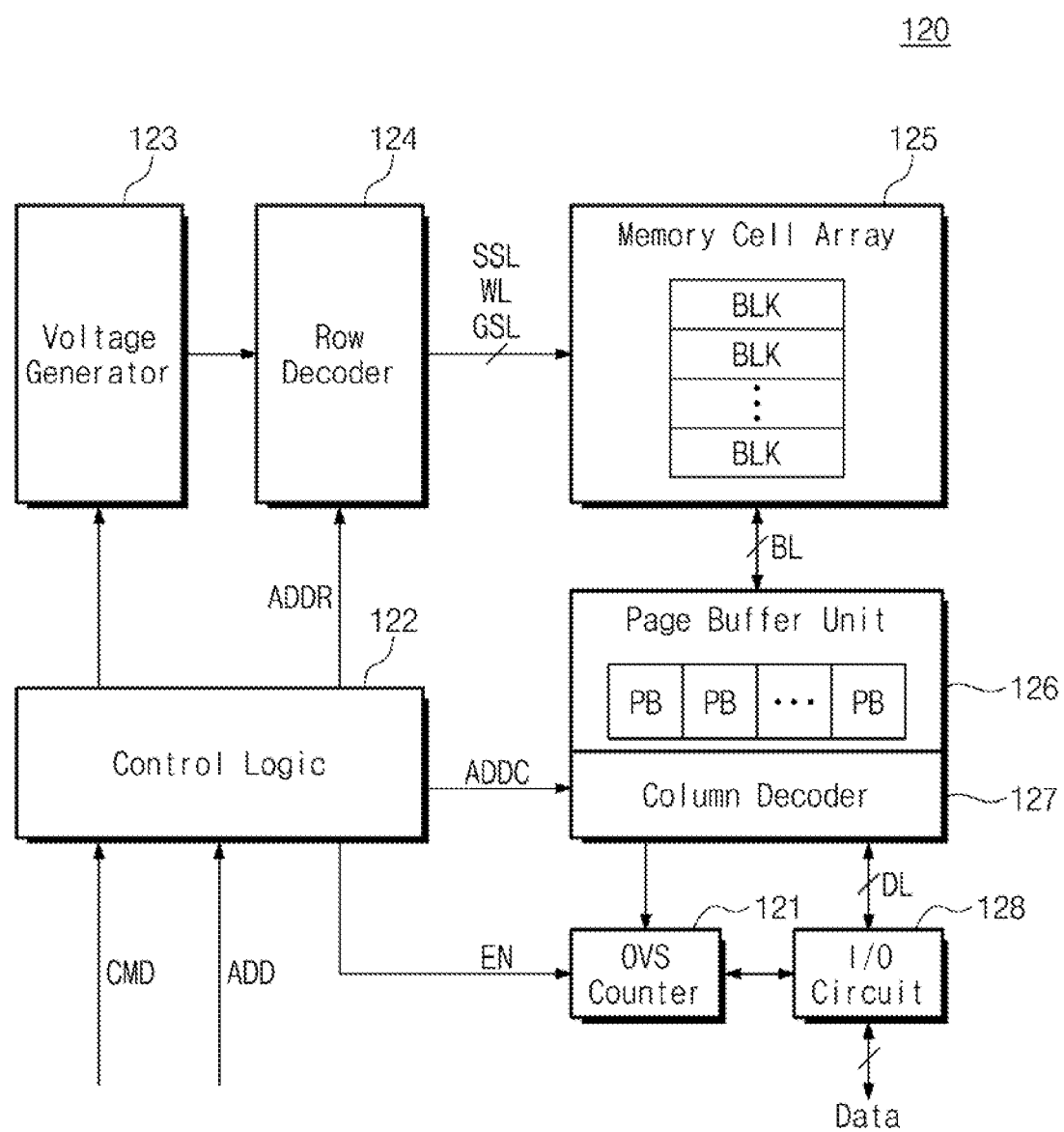
FIG. 3 is a block diagram illustrating a non-volatile memory device of FIG. 1 in detail, according to some example embodiments.

FIG. 3 is a block diagram illustrating a non-volatile memory device of FIG. 1 in detail, according to some example embodiments. FIG. 4 is a diagram describing a memory block of a memory cell array of FIG. 3, according to some example embodiments.

Referring to FIGS. 1, 3, and 4, the non-volatile memory device 120 may communicate with the storage controller 110. For example, the non-volatile memory device 120 may receive the address ADD and the command CMD from the storage controller 110. The non-volatile memory device 120 may exchange data with the storage controller 110.

The non-volatile memory device 120 may include the OVS counter 121, control logic 122, a voltage generator 123, a row decoder 124, a memory cell array 125, a page buffer unit 126, a column decoder 127, and an input/output (I/O) circuit 128. The OVS counter 121 is similar to the OVS counter 121 of FIG. 1, and thus, additional description will be omitted to avoid redundancy.

The control logic 122 may receive the command CMD and the address ADD from the storage controller 110. The command CMD may refer to a signal indicating an operation to be performed by the non-volatile memory device 120, such as a read operation, a write operation, or an erase operation. The address ADD may include a row address ADDR and a column address ADDC. The control logic 122 may control an overall operation of the non-volatile memory device 120 based on the command CMD and the address ADD. The control logic 122 may generate the row address ADDR and the column address ADDC based on the address ADD.

The control logic 122 may manage the command CMD including the OVS read request.

The control logic 122 may generate an enable signal EN based on the OVS read request. The control logic 122 may control the OVS counter 121 based on the enable signal EN, so as to generate OVS count data.

The control logic 122 may manage the command CMD including a request for the OVS count data. For example, based on the request for the OVS count data, the control logic 122 may allow the OVS counter 121 to provide the OVS count data to the storage controller 110 through the I/O circuit 128.

The control logic 122 may manage the command CMD including the read reclaim request. For example, based on the read reclaim request, the control logic 122 may copy data of a first memory region to a second memory region and may erase the data of the first memory region.

Under control of the control logic 122, the voltage generator 123 may control voltages to be applied to the memory cell array 125 through the row decoder 124.

The row decoder 124 may receive the row address ADDR from the control logic 122. The row decoder 124 may be connected with the memory cell array 125 through string selection lines SSL, word lines WL, and ground selection lines GSL. The row decoder 124 may decode the row address ADDR, and may control voltages to be applied to the string selection lines SSL, the word lines WL, and the ground selection lines GSL based on a decoding result and a voltage(s) received from the voltage generator 123.

The memory cell array 125 may include a plurality of memory blocks BLK. Each of the plurality of memory blocks BLK may be similar in structure to a memory block BLK illustrated in FIG. 4. The memory block BLK illustrated in FIG. 4 may correspond to a physical erase unit of the non-volatile memory device 120. In another implementation, the physical erase unit may be a page unit, a word line unit, a sub-block unit, or the like.

Referring to FIG. 4, the memory block BLK may include a plurality of cell strings CS11, CS12, CS21, and CS22. The plurality of cell strings CS11, CS12, CS21, and CS22 may be arranged in a row direction and a column direction. For brevity of drawing, 4 cell strings CS11, CS12, CS21, and CS22 are illustrated in FIG. 4, but the number of cell strings may increase or decrease in the row direction or the column direction.

Cell strings placed at the same column from among the plurality of cell strings CS11, CS12, CS21, and CS22 may be connected with the same bit line. For example, the cell strings CS11 and CS21 may be connected with a first bit line BL1, and the cell strings CS12 and CS22 may be connected with a second bit line BL2. Each of the plurality of cell strings CS11, CS12, CS21, and CS22 may include a plurality of cell transistors. Each of the plurality of cell transistors may be implemented with a charge trap flash (CTF) memory cell. The plurality of cell transistors may be stacked in a height direction that is a direction perpendicular to a plane (e.g., a semiconductor substrate (not illustrated)) defined by the row direction and the column direction.

The plurality of cell transistors may be connected in series between a corresponding bit line (e.g., BL1 or BL2) and a common source line CSL. For example, the plurality of cell transistors may include string selection transistors SSTa and SSTb, dummy memory cells DMC1 and DMC2, memory cells MC1 to MC4, and ground selection transistors GSTa and GSTb. The serially-connected string selection transistors SSTa and SSTb may be provided between the serially-connected memory cells MC1 to MC4 and the corresponding bit line (e.g., BL1 and BL2). The serially-connected ground selection transistors GSTa and GSTb may be provided between the serially-connected memory cells MC1 to MC4 and the common source line CSL.

The second dummy memory cell DMC2 may be provided between the serially-connected string selection transistors SSTa and SSTb and the serially-connected memory cells MC1 to MC4. The first dummy memory cell DMC1 may be provided between the serially-connected memory cells MC1 to MC4 and the serially-connected ground selection transistors GSTa and GSTb.

Memory cells placed at the same height from among the memory cells MC1 to MC4 of the plurality of cell strings CS11, CS12, CS21, and CS22 may share the same word line. For example, the first memory cells MC1 of the plurality of cell strings CS11, CS12, CS21, and CS22 may be placed at the same height from the semiconductor substrate (not illustrated) and may share a first word line WL1, the second memory cells MC2 of the plurality of cell strings CS11, CS12, CS21, and CS22 may be placed at the same height from the semiconductor substrate and may share a second word line WL2, the third memory cells MC3 of the plurality of cell strings CS11, CS12, CS21, and CS22 may be placed at the same height from the semiconductor substrate and may share a third word line WL3, and the fourth memory cells MC4 of the plurality of cell strings CS11, CS12, CS21, and CS22 may be placed at the same height from the semiconductor substrate and may share a fourth word line WL4.

Dummy memory cells placed at the same height from among the dummy memory cells DMC1 and DMC2 of the plurality of cell strings CS11, CS12, CS21, and CS22 may share the same dummy word line. For example, the first dummy memory cells DMC1 of the plurality of cell strings CS11, CS12, CS21, and CS22 may share a first dummy word line DWL1, and the second dummy memory cells DMC2 of the plurality of cell strings CS11, CS12, CS21, and CS22 may share a second dummy word line DWL2.

String selection transistors placed at the same height and the same row from among the string selection transistors SSTa and SSTb of the plurality of cell strings CS11, CS12, CS21, and CS22 may share the same string selection line. For example, the string selection transistors SSTb of the cell strings CS11 and CS12 may share a string selection line SSL1b, and the string selection transistors SSTa of the cell strings CS11 and CS12 may share a string selection line SSL1a. The string selection transistors SSTb of the cell strings CS21 and CS22 may be connected with a string selection line SSL2b, and the string selection transistors SSTa of the cell strings CS21 and CS22 may be connected with a string selection line SSL2a.

Ground selection transistors placed at the same height and the same row from among the ground selection transistors GSTa and GSTb of the plurality of cell strings CS11, CS12, CS21, and CS22 may be connected with the same ground selection line. For example, the ground selection transistors GSTb of the cell strings CS11 and CS12 may be connected with a ground selection line GSL2a, and the ground selection transistors GSTa of the cell strings CS11 and CS12 may be connected with a ground selection line GSL1a. The ground selection transistors GSTb of the cell strings CS21 and CS22 may be connected with a ground selection line GSL2b, and the ground selection transistors GSTa of the cell strings CS21 and CS22 may be connected with a ground selection line GSL1b.

The memory block BLK illustrated in FIG. 4 is an example. In other implementations, the number of cell strings may increase or decrease, and the number of rows of cell strings and the number of columns of cell strings may increase or decrease depending on the number of cell strings. Also, in the memory block BLK, the number of cell transistors may increase or decrease, the height of the memory block BLK may increase or decrease depending on the number of cell transistors, and the number of lines connected with the cell transistors may increase or decrease depending on the number of cell transistors.

The memory block BLK may include a plurality of memory pages. For example, the first memory cells MC1 of the cell strings CS11, CS12, CS21, and CS22 connected with the first word lines WL1 may be referred to as a "first physical page". In some example embodiments, one physical page may correspond to a plurality of logical pages. For example, in the case where a memory cell is a triple level cell (TLC) storing information corresponding to 3 bits, a physical page may correspond to 3 logical pages. A multi-level cell storing two or more bits will be described in detail with reference to FIGS. 5A, 5B, and 5C.

Referring again to FIGS. 1 and 3, the page buffer unit 126 may include a plurality of page buffers PB. The page buffer unit 126 may be connected with the memory cell array 125 through the bit lines BL. The page buffer unit 126 may read data from the memory cell array 125 in units of page, by sensing voltages of the bit lines BL.

The column decoder 127 may receive the column address ADDC from the control logic 122. The column decoder 127 may decode the column address ADDC, and may provide the data read by the page buffer unit 126 to the I/O circuit 128 based on a decoding result.

The column decoder 127 may receive data from the I/O circuit 128 through data lines DL. The column decoder 127 may receive the column address ADDC from the control logic 122. The column decoder 127 may decode the column address ADDC, and may provide the data received from the I/O circuit 128 to the page buffer unit 126 based on a decoding result. The page buffer unit 126 may store the data provided from the I/O circuit 128 in the memory cell array 125 through the bit lines BL in units of page.

The I/O circuit 128 may be connected with the column decoder 127 through the data lines DL. The I/O circuit 128 may provide data received from the storage controller 110 to the column decoder 127 through the data lines DL. The I/O circuit 128 may output data received through the data lines DL to the storage controller 110.

The address ADD, the command CMD, and the data described with reference to FIG. 3 may be transmitted/received through the non-volatile memory interface circuit 119 of the storage controller 110 of FIG. 2.

Figure 5A:
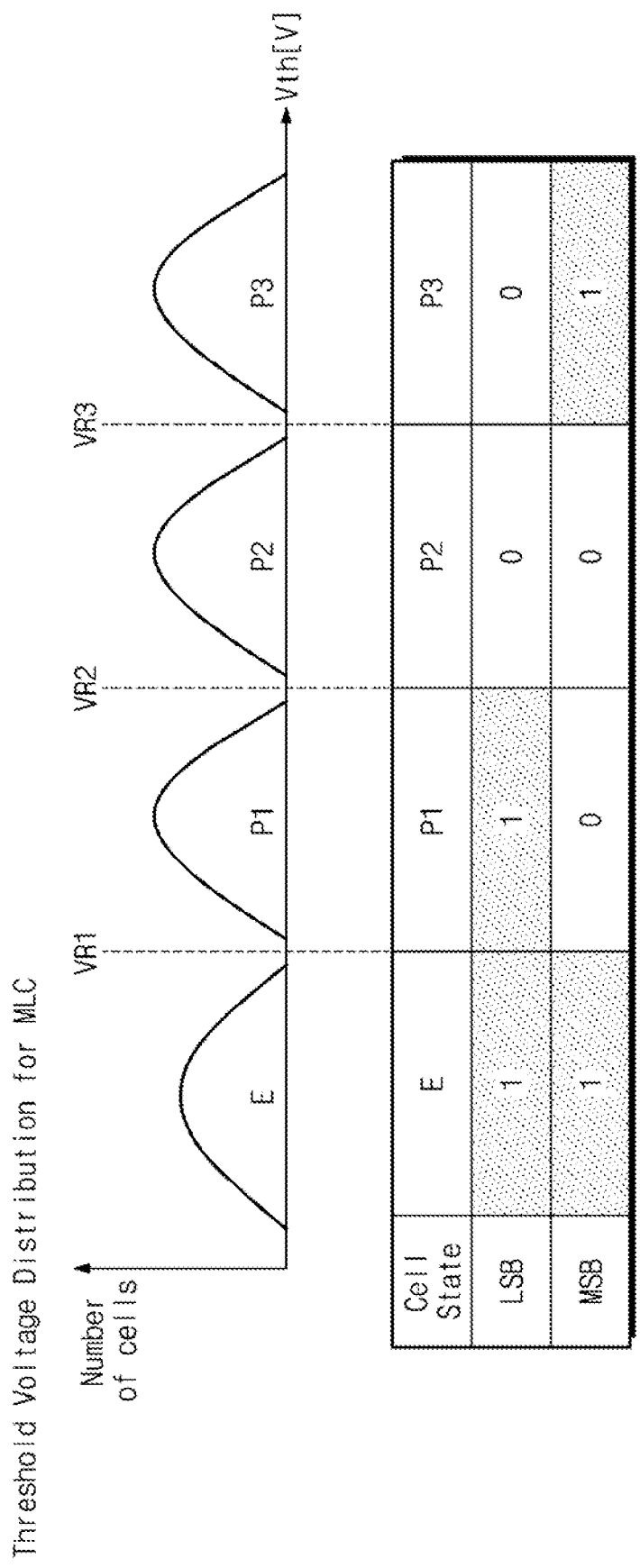
FIG. 5A is a diagram illustrating threshold voltage distributions of multi-level cells according to some example embodiments.

FIG. 5A is a diagram illustrating threshold voltage distributions of multi-level cells according to some example embodiments.

A graph of threshold voltage distributions of multi-level cells MLC each storing 2 bits and a bit table for each page corresponding to the threshold voltage distributions are illustrated in FIG. 5A. In the graph in FIG. 5A of the multi-level cell MLC, a horizontal axis represents a threshold voltage (e.g., a level of a threshold voltage), and a vertical axis represents the number of cells.

For convenience of description, the multi-level cell MLC is intended to refer to a memory cell storing 2 bits, a memory cell storing 3 bits is referred to as a "triple level cell TLC", and a memory cell storing 4 bits is referred to as a "quadruple level cell QLC".

The multi-level cell MLC may have one of an erase state "E" and first to third programming states P1, P2, and P3 in which the threshold voltage distributions sequentially increase. A first read voltage VR1 may be a voltage for distinguishing the erase state "E" from the first programming state P1. A second read voltage VR2 may be a voltage for distinguishing the first programming state P1 from the second programming state P2. A third read voltage VR3 may be a voltage for distinguishing the second programming state P2 from the third programming state P3.

Referring to the table in FIG. 5A of the multi-level cell MLC, a most significant bit MSB and a least significant bit LSB according to a cell state are illustrated. A physical page corresponding to the multi-level cell MLC storing 2 bits may correspond to a first logical page and a second logical page. In the multi-level cell MLC, the first logical page may indicate the least significant bit LSB, and the second logical page may indicate the most significant bit MSB.

Each of the first to third read voltages VR1 to VR3 of the multi-level cell MLC may correspond to one of a plurality of logical pages. For example, in the multi-level cell MLC, a read operation corresponding to the first logical page may be performed based on the second read voltage VR2. A read operation corresponding to the second logical page may be performed based on the first read voltage VR1 and the third read voltage VR3.

Figure 5B:
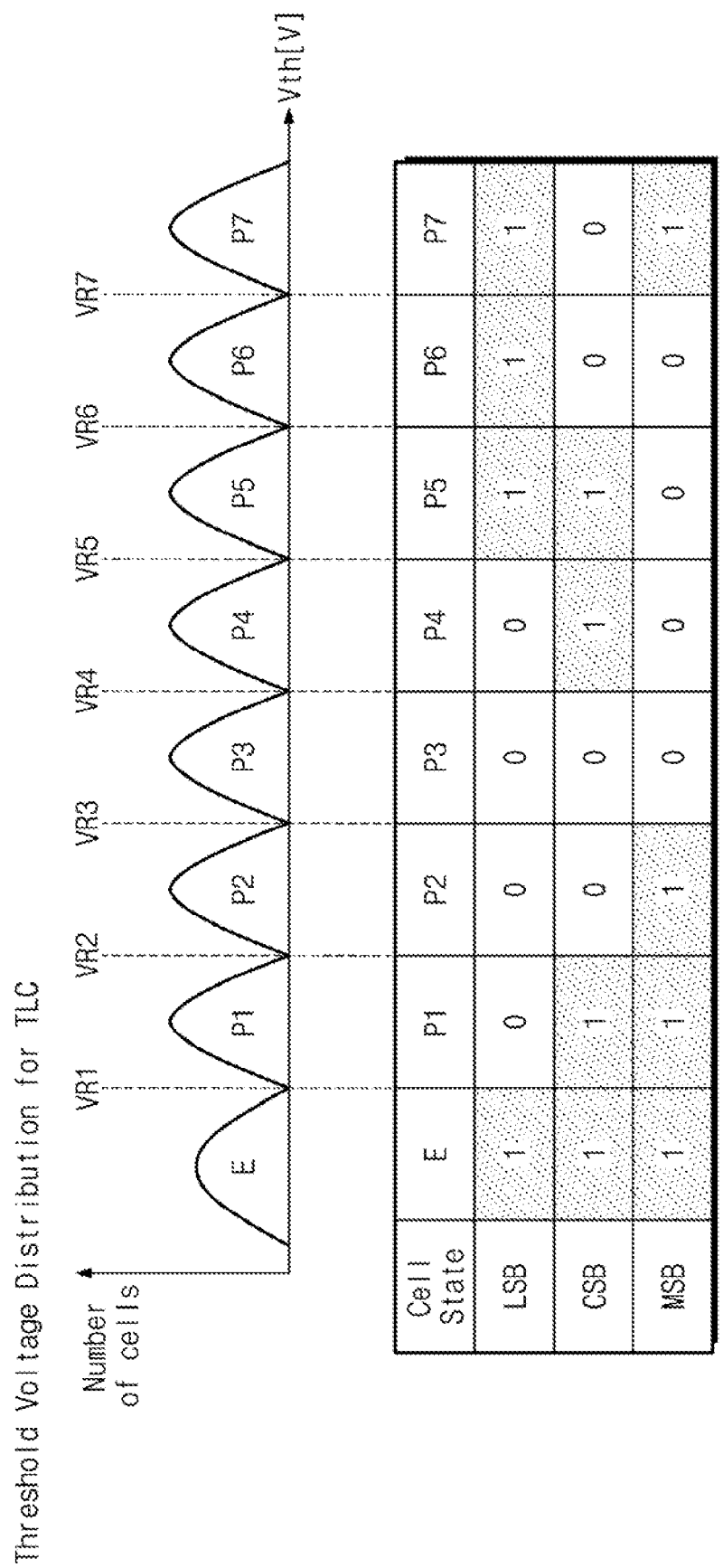
FIG. 5B is a diagram illustrating threshold voltage distributions of triple level cells according to some example embodiments.

FIG. 5B is a diagram illustrating threshold voltage distributions of triple level cells according to some example embodiments.

A graph in FIG. 5B of threshold voltage distributions of the triple level cells TLC each storing 3 bits and a bit table for each page corresponding to the threshold voltage distributions are illustrated. In the graph in FIG. 5B of the triple level cell TLC, a horizontal axis represents a threshold voltage (e.g., a level of a threshold voltage), and a vertical axis represents the number of cells.

The triple level cell TLC may have one of an erase state "E" and first to seventh programming states P1, P2, P3, P4, P5, P6, and P7 in which threshold voltage distributions sequentially increase. A first read voltage VR1 may be a voltage for distinguishing the erase state "E" from the first programming state P1. Likewise, each of second to seventh read voltages VR2 to VR7 may be a voltage for distinguishing each of the second to seventh programming states P2 to P7 from a previous state (i.e., an immediately previous state having a low threshold voltage distribution).

Referring to the table in FIG. 5B of the triple level cell TLC, a least significant bit LSB, a center significant bit CSB, and a most significant bit MSB according to a cell state are illustrated. A physical page corresponding to the triple level cell TLC storing 3 bits may correspond to a first logical page, a second logical page, and a third logical page. In the triple level cell TLC, the first logical page may indicate the least significant bit LSB, the second logical page may indicate the center significant bit CSB, and the third logical page may indicate the most significant bit MSB.

Each of the first to seventh read voltages VR1 to VR7 of the triple level cell TLC may correspond to one of a plurality of logical pages. For example, in the triple level cell TLC, a read operation corresponding to the first logical page may be performed based on the first read voltage VR1 and the fifth read voltage VR5. A read operation corresponding to the second logical page may be performed based on the second read voltage VR2, the fourth read voltage VR4, and the sixth read voltage VR6. A read operation corresponding to the third logical page may be performed based on the third read voltage VR3 and the seventh read voltage VR7.

Figure 5C:
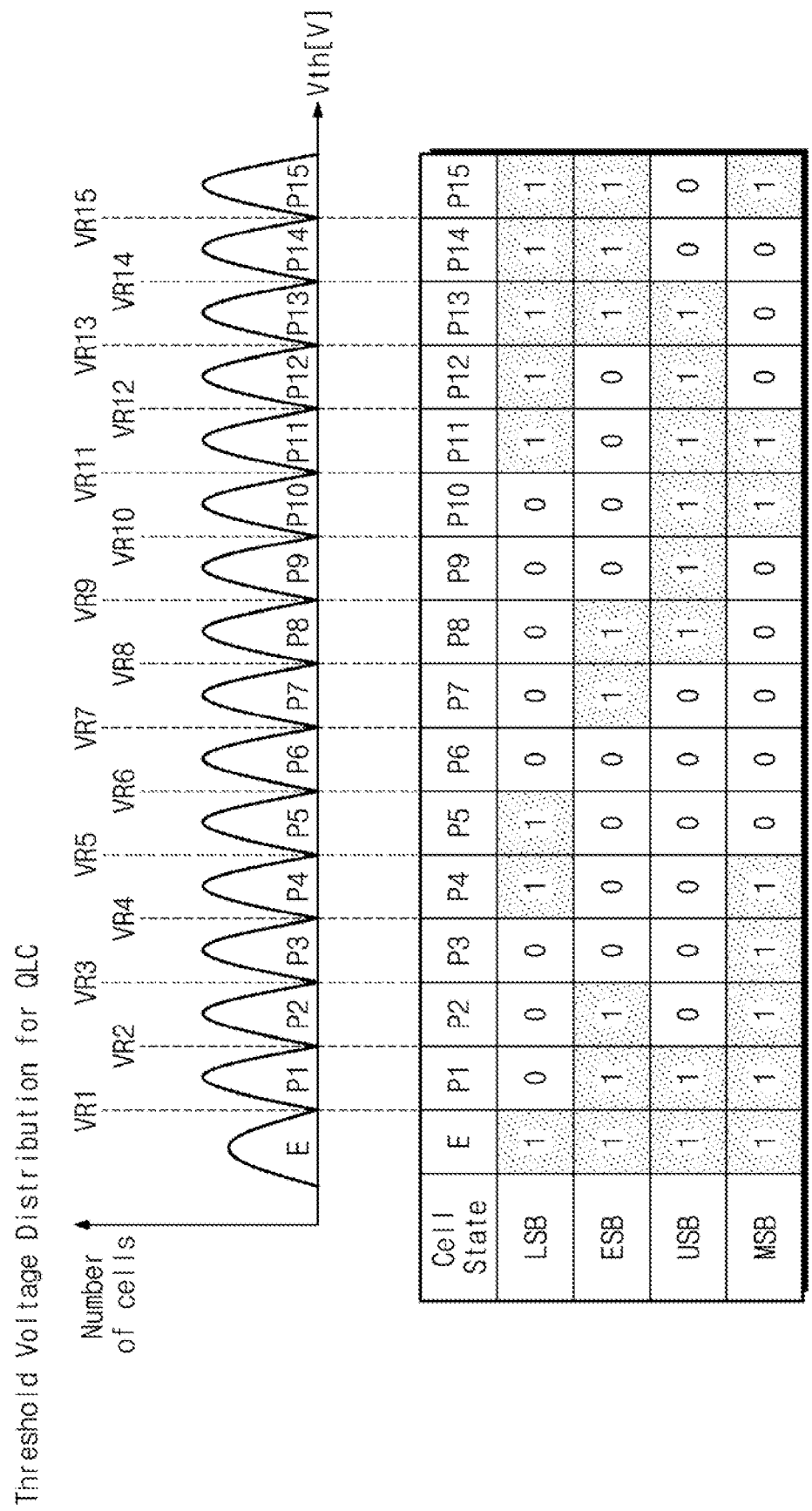
FIG. 5C is a diagram illustrating threshold voltage distributions for quadruple level cells, according to some example embodiments.

FIG. 5C is a diagram illustrating threshold voltage distributions for quadruple level cells, according to some example embodiments.

A graph of threshold voltage distributions of the quadruple level cells QLC each storing 4 bits and a bit table for each page corresponding to the threshold voltage distributions are illustrated in FIG. 5C. In the graph in FIG. 5C of the quadruple level cell QLC, a horizontal axis represents a threshold voltage (e.g., a level of a threshold voltage), and a vertical axis represents the number of cells.

The quadruple level cell QLC may have one of an erase state "E" and first to fifteenth programming states P1, P2, P3, P4, P5, P6, P7, P8, P9, P10, P11, P12, P13, P14, and P15 in which threshold voltage distributions sequentially increase. A first read voltage VR1 may be a voltage for distinguishing the erase state "E" from the first programming state P1. Likewise, each of second to fifteenth read voltages VR2 to VR15 may be a voltage for distinguishing each of the second to fifteenth programming states P2 to P15 from a previous state (i.e., an immediately previous state having a low threshold voltage distribution).

Referring to the table in FIG. 5C of the quadruple level cell QLC, a least significant bit LSB, a first center significant bit ESB, a second center significant bit USB, and a most significant bit MSB according to a cell state are illustrated. A physical page corresponding to the quadruple level cell QLC storing 4 bits may correspond to a first logical page, a second logical page, a third logical page, and a fourth logical page. In the quadruple level cell QLC, the first logical page may indicate the least significant bit LSB, the second logical page may indicate the first center significant bit ESB, the third logical page may indicate the second center significant bit USB, and the fourth logical page may indicate the most significant bit MSB.

Each of the first to fifteenth read voltages VR1 to VR15 of the quadruple level cell QLC may correspond to one of a plurality of logical pages. For example, in the quadruple level cell QLC, a read operation corresponding to the first logical page may be performed based on the first, fourth, sixth, and eleventh read voltages VR1, VR4, VR6, and VR11. A read operation corresponding to the second logical page may be performed based on the third, seventh, ninth, and thirteenth read voltages VR3, VR7, VR9, and VR13. A read operation corresponding to the third logical page may be performed based on the second, eighth, and fourteenth read voltages VR2, VR8, and VR14. A read operation corresponding to the fourth logical page may be performed based on the fifth, tenth, twelfth, and fifteenth read voltages VR5, VR10, VR12, and VR15.

Above, the states and the read voltages of the multi-level cell MLC, the triple level cell TLC, and the quadruple level cell QLC are described with reference to FIGS. 5A, 5B, and 5C. However, read voltages corresponding to each logical page may be variously changed or modified, and one memory cell may store 5 or more bits.

Figure 6:
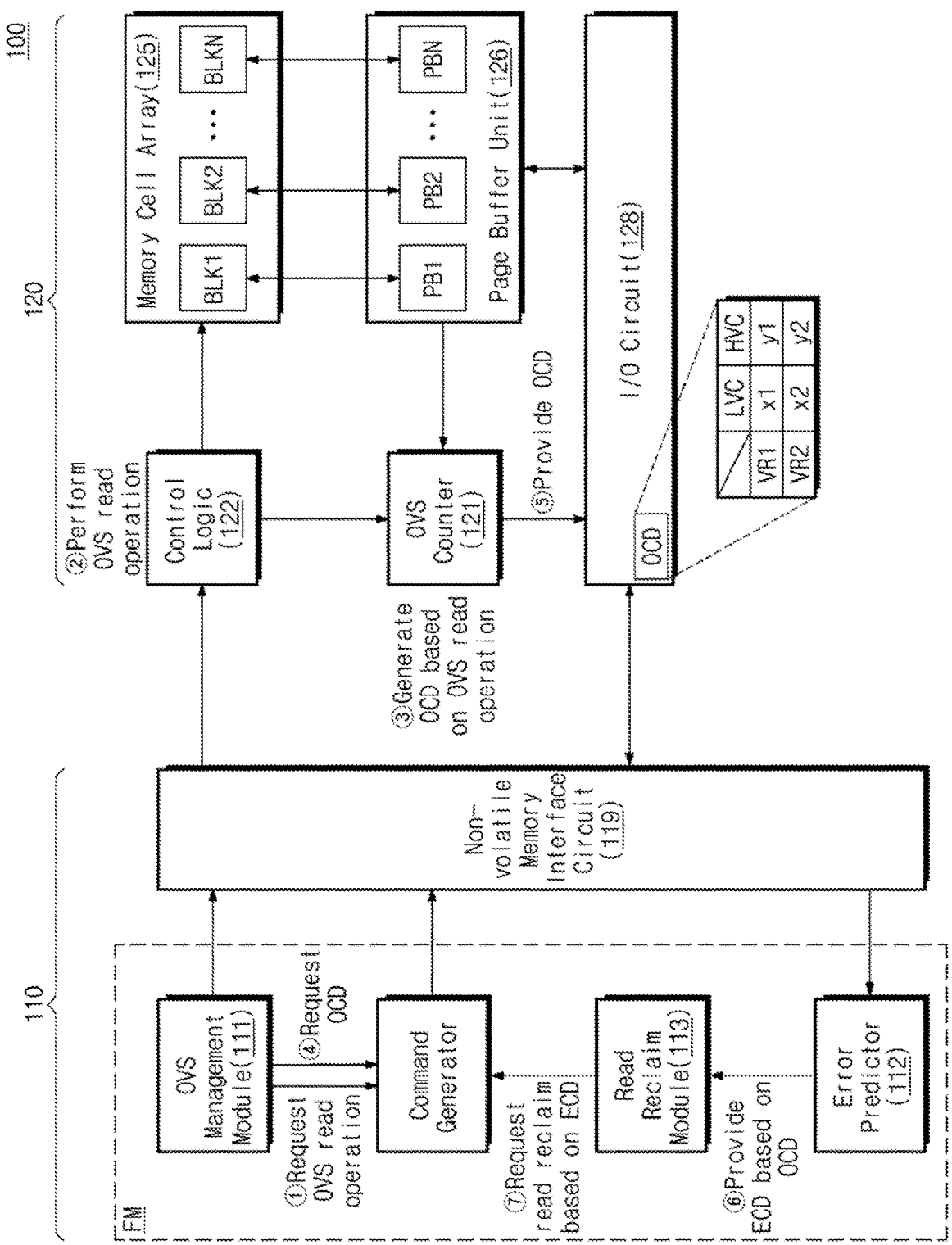
FIG. 6 is a diagram describing an operating method of a storage device according to some example embodiments.

FIG. 6 is a diagram describing an operating method of a storage device according to some example embodiments.

Referring to FIG. 6, the storage device 100 may include the storage controller 110 and the non-volatile memory device 120. The storage device 100 may correspond to the storage device 100 of FIG. 1.

The storage controller 110 may include the firmware memory FM and the non-volatile memory interface circuit 119. The firmware memory FM may include the OVS management module 111, the error predictor 112, the read reclaim module 113, and a command generator. The OVS management module 111, the error predictor 112, and the read reclaim module 113 are similar to the OVS management module 111, the error predictor 112, and the read reclaim module 113 of FIG. 2, and thus, additional description will be omitted to avoid redundancy.

The firmware memory FM may include the command generator. The command generator may generate a command indicating an operation to be performed by the non-volatile memory device 120, such as a read operation, a write operation, or an erase operation. The command generator may generate the command including the OVS read request and the command including the request for OVS count data OCD, under control of the OVS management module 111. The command generator may generate the command including the read reclaim request under control of the read reclaim module 113. In another implementation, the command generator may be implemented with a separate hardware device.

The non-volatile memory device 120 may include the OVS counter 121, the control logic 122, the memory cell array 125, the page buffer unit 126, and the I/O circuit 128. The OVS counter 121, the control logic 122, the memory cell array 125, the page buffer unit 126, and the I/O circuit 128 are similar to the OVS counter 121, the control logic 122, the memory cell array 125, the page buffer unit 126, and the I/O circuit 128 of FIG. 3, and thus, additional description will be omitted to avoid redundancy.

Below, an operating method of the storage device 100 according to some example embodiments will be described.

In a first operation ①, the OVS management module 111 may request the OVS read operation. The command generator may provide the command including the OVS read request to the non-volatile memory interface circuit 119 under control of the OVS management module 111. The non-volatile memory interface circuit 119 may provide the command including the OVS read request to the non-volatile memory device 120. The OVS read request may direct an operation of reading data stored in the memory cell array 125 and generating the OVS count data OCD corresponding to the read data.

In a second operation ②, the control logic 122 may perform the OVS read operation based on the command in the first operation ①. For example, the control logic 122 may control the memory cell array 125 such that data (i.e., read data) corresponding to the OVS read operation are output to the page buffer unit 126. The read data may be used for the OVS counter 121 to generate the OVS count data OCD. The page buffer unit 126 may provide the I/O circuit 128 with the data read from the memory cell array 125. The I/O circuit 128 may provide the read data to the storage controller 110.

In a third operation ③, the OVS counter 121 may generate the OVS count data OCD based on the OVS read operation in operation ②. For example, under control of the control logic 122, data stored in memory blocks BLK1 to BLKN of the memory cell array 125 may be provided to the page buffer unit 126 in units of page. Page buffers PB1 to PBN of the page buffer unit 126 may store the data read (or sensed) from the memory blocks BLK1 to BLKN. After the page buffer unit 126 stores the read data according to the second operation ②, the OVS counter 121 may generate the OVS count data OCD with reference to the page buffer unit 126.

The OVS count data OCD may be generated with regard to a memory region in the memory cell array 125. The memory region may correspond to a set of a plurality of memory cells, such as a memory channel, a memory chip, a memory plane, or a memory block in the non-volatile memory device 120.

The OVS count data OCD may include an OVS count value corresponding to each of a plurality of read voltages. The OVS count value may include a low area count LAC and a high area count HAC. A value of the low area count LAC may refer to a value that is obtained by counting the number of memory cells each having a threshold voltage within a voltage level section lower than the corresponding read voltage. A value of the high area count HAC may refer to a value that is obtained by counting the number of memory cells each having a threshold voltage within a voltage level section higher than the corresponding read voltage.

For example, the OVS count data OCD may include "x1", "y1", "x2", and "y2", wherein "x1" may be a value of the low area count LAC of the first read voltage VR1, "y1" may be a value of the high area count HAC of the first read voltage VR1, "x2" may be a value of the low area count LAC of the second read voltage VR2, and "y2" may be a value of the high area count HAC of the second read voltage VR2.

For better understanding, the OVS count data OCD are illustrated as including count values associated with the first read voltage VR1 and the second read voltage VR2, but the OVS count data OCD may further include count values associated with any other read voltage.

The read voltages of the OVS count data OCD may correspond to the same logical page. For example, in the case of reading the least significant bit LSB of the multi-level cell MLC, the OVS count data OCD may include count values (i.e., a low area count value and a high area count value) of the second read voltage VR2. In the case of reading the most significant bit MSB of the multi-level cell MLC, the OVS count data OCD may include count values of each of the first and third read voltages VR1 and VR3 (refer to FIG. 5A).

For example, in the case of reading the least significant bit LSB of the triple level cell TLC, the OVS count data OCD may include count values of each of the first and fifth read voltages VR1 and VR5. In the case of reading the center significant bit CSB of the triple level cell TLC, the OVS count data OCD may include count values of each of the second, fourth, and sixth read voltages VR2, VR4, and VR6. In the case of reading the most significant bit MSB of the triple level cell TLC, the OVS count data OCD may include count values of each of the third and seventh read voltages VR3 and VR7 (refer to FIG. 5B).

For example, in the case of reading the least significant bit LSB of the quadruple level cell QLC, the OVS count data OCD may include count values of each of the first, fourth, sixth, and eleventh voltages VR1, VR4, VR6, and VR11. In the case of reading the first center significant bit ESB of the quadruple level cell QLC, the OVS count data OCD may include count values of each of the third, seventh, ninth, and thirteenth voltages VR3, VR7, VR9, and VR13. In the case of reading the second center significant bit USB of the quadruple level cell QLC, the OVS count data OCD may include count values of each of the second, eighth, and fourteenth voltages VR2, VR8, and VR14. In the case of reading the most significant bit MSB of the quadruple level cell QLC, the OVS count data OCD may include count values of each of the fifth, tenth, twelfth, and fifteenth voltages VR5, VR10, VR12, and VR15 (refer to FIG. 5C).

In a fourth operation ④, the OVS management module 111 may request the OVS count data OCD. The command generator may provide the command including the request for the OVS count data OCD to the non-volatile memory interface circuit 119 under control of the OVS management module 111. The non-volatile memory interface circuit 119 may provide the command including the request for the OVS count data OCD to the non-volatile memory device 120.

In a fifth operation ⑤, the OVS counter 121 may provide the OVS count data OCD to the I/O circuit 128 based on the command in the fourth operation ④. The I/O circuit 128 may provide the OVS count data OCD to the storage controller 110.

In a sixth operation ⑥, the non-volatile memory interface circuit 119 may provide the error predictor 112 with the OVS count data OCD received from the non-volatile memory device 120. The error predictor 112 may generate error count data ECD based on the OVS count data OCD. For example, the error predictor 112 may perform pre-training on the correspondence relationship based on a plurality of pairs of the OVS count data OCD and the error count data ECD, and the error predictor 112 may predict the error count data ECD from the OVS count data OCD, based on the pre-trained correspondence relationship. The error predictor 112 may provide the error count data ECD to the read reclaim module 113.

The error count data ECD may include error count values associated with each of different read voltages. For example, the error count data ECD may include a first error count value for the first read voltage VR1 and a second error count value for the second read voltage VR2. The first error count value may include a value of the low area count LAC and a value of the high area count HAC associated with the first read voltage VR1. The second error count value may include a value of the low area count LAC and a value of the high area count HAC associated with the second read voltage VR2.

In a seventh operation ⑦, the read reclaim module 113 may determine whether to perform the read reclaim operation on the memory region based on the error count data ECD. When it is determined that the read reclaim is called for, the read reclaim module 113 may provide the read reclaim request to the command generator. The command generator may provide the command including the read reclaim request to the non-volatile memory interface circuit 119. The non-volatile memory interface circuit 119 may provide the command including the read reclaim request to the non-volatile memory device 120.

The read reclaim module 113 may determine whether a read reclaim condition of the memory region is satisfied, based on the error count data ECD. The read reclaim condition may define a situation that is used as a criterion for performing the read reclaim operation. For example, whether the read reclaim condition is satisfied may be determined by comparing reference values corresponding to the error count values included in the error count data ECD. A reference value may be defined for each read voltage. The reference value may refer to the number of memory cells, which is used as a criterion under which the storage controller 110 requests read reclaim.

For example, the error count data ECD may include the first error count value and the second error count value. When the first error count value is greater than a first reference value or the second error count value is greater than a second reference value, the read reclaim module 113 may determine that the read reclaim condition of the memory region is satisfied. In this case, the read reclaim module 113 may provide the read reclaim request to the command generator.

For example, when the first error count value is smaller than or equal to the first reference value or the second error count value is smaller than or equal to the second reference value, the read reclaim module 113 may determine that the read reclaim condition of the memory region is not satisfied. In this case, the read reclaim module 113 may not provide the read reclaim request to the command generator. As such, the command generator may perform various subsequent operations such as an operation in which a normal read command is generated depending on a request of a host.

Figure 7:
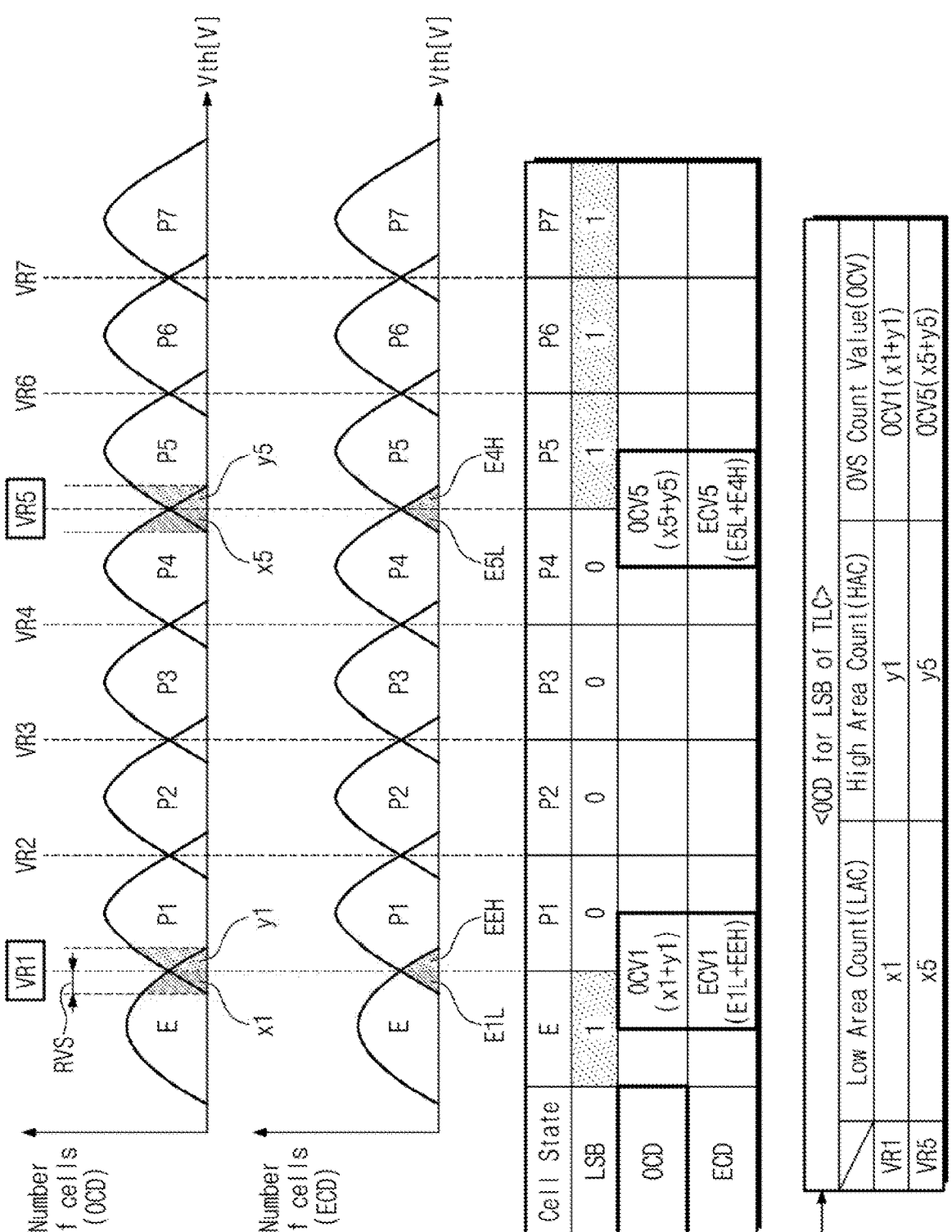
FIG. 7 is a diagram describing OVS count data and error count data of FIG. 6 according to some example embodiments.

FIG. 7 is a diagram describing OVS count data and error count data of FIG. 6 according to some example embodiments.

The OVS count data OCD and the error count data ECD that are associated with the case of reading the least significant bit LSB of the triple level cell TLC will be described with reference to FIG. 7.

In graphs in FIG. 7 of the OVS count data OCD and the error count data ECD, a horizontal axis represents a threshold voltage, and a vertical axis represents the number of cells.

The first and fifth read voltages VR1 and VR5 may correspond to a logical page of the least significant bit LSB of the triple level cell TLC.

Referring to the graph in FIG. 7 of the OVS count data OCD, "x1" may be a value of the low area count LAC of the first read voltage VR1, and "x1" may be a value that is obtained by counting the number of memory cells each having a threshold voltage between the first read voltage VR1 and a voltage lower than the first read voltage VR1 as much as a reference voltage section RVS. Also, "y1" may be a value of the high area count HAC of the first read voltage VR1, and "y1" may be a value that is obtained by counting the number of memory cells each having a threshold voltage between the first read voltage VR1 and a voltage higher than the first read voltage VR1 as much as the reference voltage section RVS. A sum of "x1" and "y1" may be referred to as a "first OVS count value OCV1 of the first read voltage VR1".

As in the above description, "x5" may be a value of the low area count LAC of the fifth read voltage VR5, and "x5" may be a value that is obtained by counting the number of memory cells each having a threshold voltage between the fifth read voltage VR5 and a voltage lower than the fifth read voltage VR5 as much as the reference voltage section RVS. Also, "y5" may be a value of the high area count HAC of the fifth read voltage VR5, and "y5" may be a value that is obtained by counting the number of memory cells each having a threshold voltage between the fifth read voltage VR5 and a voltage higher than the fifth read voltage VR5 as much as the reference voltage section RVS. A sum of "x5" and "y5" may be referred to as a "fifth OVS count value OCV5 of the fifth read voltage VR5".

The OVS count data OCD may include a low area count value and a high area count value that are associated with each of read voltages corresponding to the same logical page. In the case of reading the least significant bit LSB of the triple level cell TLC, the OVS count data OCD may include the first and fifth OVS count values OCV1 and OCV5 respectively corresponding to the first and fifth read voltages VR1 and VR5.

Referring to the graph of the error count data ECD, "E1L" may indicate the number of error memory cells (e.g., memory cells whose bit values are flipped) each having the erase state "E" even though programmed to the first programming state P1, and "EEH" may indicate the number of error memory cells each having a threshold voltage of the first programming state P1 even though not programmed or programmed to the erase state "E". A sum of "E1L" and "EEH" may be referred to as a "first error count value ECV1 of the first read voltage VR1".

As in the above description, "E5L" may indicate the number of error memory cells each having a threshold voltage of the fourth programming state P4 even though programmed to the fifth programming state P5. As in the above description, "E4H" may indicate the number of error memory cells each having a threshold voltage of the fifth programming state P5 even though programmed to the fourth programming state P4. A sum of "E5L" and "E4H" may be referred to as a "fifth OVS count value ECV5 of the fifth read voltage VR5".

According to example embodiments, the OVS count data OCD and the error count data ECD may have a correspondence relationship. For example, "x1" and "y1" of the first OVS count value OCV1 may correspond to "E1L" and "EEH" of the first error count value ECV1, and "x5" and "y5" of the fifth OVS count value OCV5 may correspond to "E5L" and "E4H" of the fifth OVS count value ECV5. In the case where each of "x1", "y1", "x5", and "y5" increases or decreases, each of "E1L", "EEH", "E5L", and "E4H" may have an increasing or decreasing tendency. That is, the OVS count data OCD may be distribution information appropriate for predicting the error count data ECD.

An error predictor according to an example embodiment may predict the error count data ECD from the OVS count data OCD based on the correspondence relationship between the OVS count data OCD and the error count data ECD.

Figure 8A:
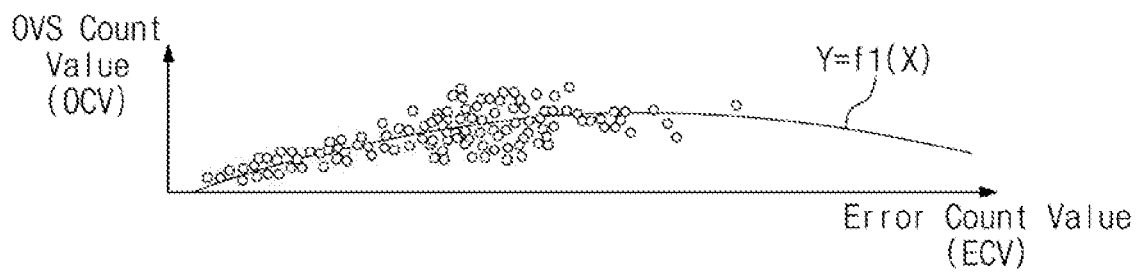
FIGS. 8A, 8B, and 8C are diagrams describing a relationship between an OVS count value and an error count value according to some example embodiments.

FIG. 8A is a diagram describing a relationship between an OVS count value and an error count value according to some example embodiments.

A plurality of pairs of an OVS count value and an error count value and a function model of a correspondence relationship drawn therefrom will be described with reference to FIG. 8A. A horizontal axis represents an error count value ECV. A vertical axis represents the OVS count value OCV.

A plurality of pairs of the OVS count value OCV and the error count value ECV associated with the fifth read voltage VR5 of the triple level cell TLC may have a non-linear correspondence relationship. An error predictor may train for the non-linear correspondence relationship based on the plurality of pairs of the OVS count value OCV and the error count value ECV and may generate a first function model f1. The first function model f1 may indicate the correspondence relationship between the OVS count value OCV and the error count value ECV associated with the fifth read voltage VR5. The error predictor may predict the error count value ECV based on the OVS count value OCV and the pre-trained first function model f1.

Figure 8B:
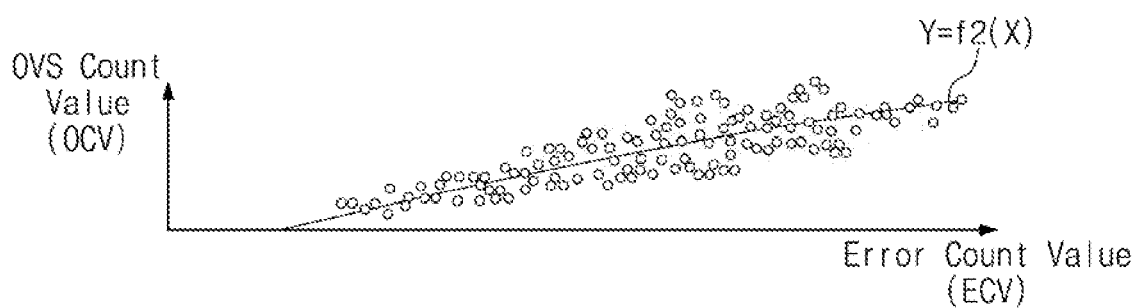

FIG. 8B is a diagram describing a relationship between an OVS count value and an error count value according to some example embodiments.

A plurality of pairs of an OVS count value and an error count value and a function model of a correspondence relationship drawn therefrom will be described with reference to FIG. 8B. A horizontal axis represents the error count value ECV. A vertical axis represents the OVS count value OCV.

A plurality of pairs of the OVS count value OCV and the error count value ECV associated with the sixth read voltage VR6 of the triple level cell TLC may have a linear correspondence relationship. An error predictor may train for the linear correspondence relationship based on the plurality of pairs of the OVS count value OCV and the error count value ECV and may generate a second function model f2. The second function model f2 may indicate the correspondence relationship between the OVS count value OCV and the error count value ECV associated with the sixth read voltage VR6. The error predictor may predict the error count value ECV based on the OVS count value OCV and the pre-trained second function model f2.

Figure 8C:
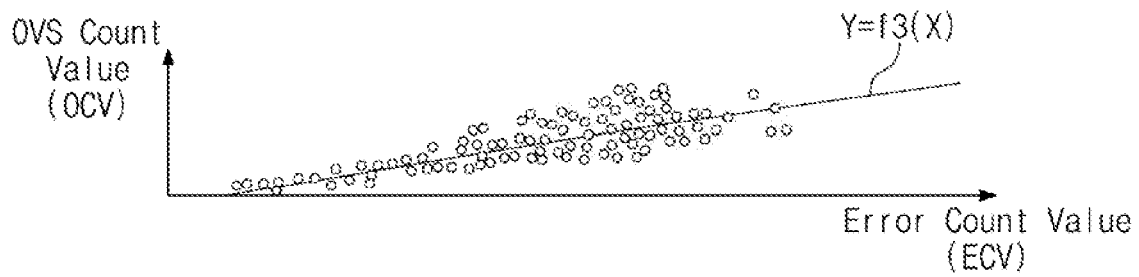

FIG. 8C is a diagram describing a relationship between an OVS count value and an error count value according to some example embodiments.

A plurality of pairs of an OVS count value and an error count value and a function model of a correspondence relationship drawn therefrom will be described with reference to FIG. 8C. A horizontal axis represents the error count value ECV. A vertical axis represents the OVS count value OCV.

A plurality of pairs of the OVS count value OCV and the error count value ECV associated with the seventh read voltage VR7 of the triple level cell TLC may have a linear correspondence relationship. An error predictor may train for the linear correspondence relationship based on the plurality of pairs of the OVS count value OCV and the error count value ECV and may generate a third function model f3. The third function model f3 may indicate the correspondence relationship between the OVS count value OCV and the error count value ECV associated with the seventh read voltage VR7. The error predictor may predict the error count value ECV based on the OVS count value OCV and the pre-trained third function model f3.

FIG. 9 is a diagram describing a distribution type table according to some example embodiments.

A distribution type table will be described with reference to FIG. 9. The distribution type table describes some of distribution types, which a memory region is capable of having, as an example. The distribution type table may include first to ninth distribution types.

A first distribution type may indicate a normal type. The normal type may be a distribution type indicating that threshold voltages of memory cells in the memory region are programmed normally.

A second distribution type may indicate a retention type. The retention type may be a distribution type indicating that threshold voltages of the memory cells decrease as a time passes from a point in time at which the memory cells in the memory region are programmed.

A third distribution type may indicate a read disturb type. The memory region may include memory cells connected with a first word line and memory cells connected with a second word line. The first word line and the second word line may be adjacent to each other. The read disturb type may be a distribution type indicating that threshold voltage distributions of the memory cells connected with the second word line are changed by a read operation of the memory cells connected with the first word line in the memory region.

A fourth distribution type may indicate a pre-programming type. In the case of a memory cell that has one of multiple programming levels, such as the quadruple level cell QLC, the programming operation may be divided into pre-programming and post-programming to improve the accuracy of programming. A threshold voltage distribution that is formed after the pre-programming is performed may be mostly lower than a threshold voltage distribution of the normal type. A threshold voltage distribution that is formed after the post-programming is performed may be similar to the threshold voltage distribution of the normal type. The pre-programming type may be a distribution type indicating that only the pre-programming of the pre-programming and the post-programming is performed.

A fifth distribution type may indicate a one-shot type. The one-shot type may be a distribution type indicating that one-shot programming is performed in the memory region. The one-shot programming may mean an operation in which the memory cells in the memory region are programmed to have an erase state or a programming state of a single level cell (SLC).

A sixth distribution type may indicate a hot-carrier injection (HCI) type. The HCI type may be a distribution type indicating that a threshold voltage distribution(s) is changed by the HCI in the memory region. The HCI may mean that a threshold voltage distribution changes as electrons or holes whose mobility is excessively high are accumulated in an insulating layer due to a hardware factor of a memory cell.

A seventh distribution type may indicate a no-coupled word line (NCW) type. The NCW type may be a distribution type indicating that threshold voltage distributions are formed to be generally low as memory cells of other word lines adjacent to a word line connected with programmed memory cells are not programmed.

An eighth distribution type may indicate a sudden power off (SPO) type. The SPO type may be a distribution type indicating that programming is abnormally performed in the memory region due to the sudden power off of a storage device.

A ninth distribution type may indicate an erase type. The erase type may be a distribution type indicating that the memory cells in the memory region are not yet programmed.

Figure 10:
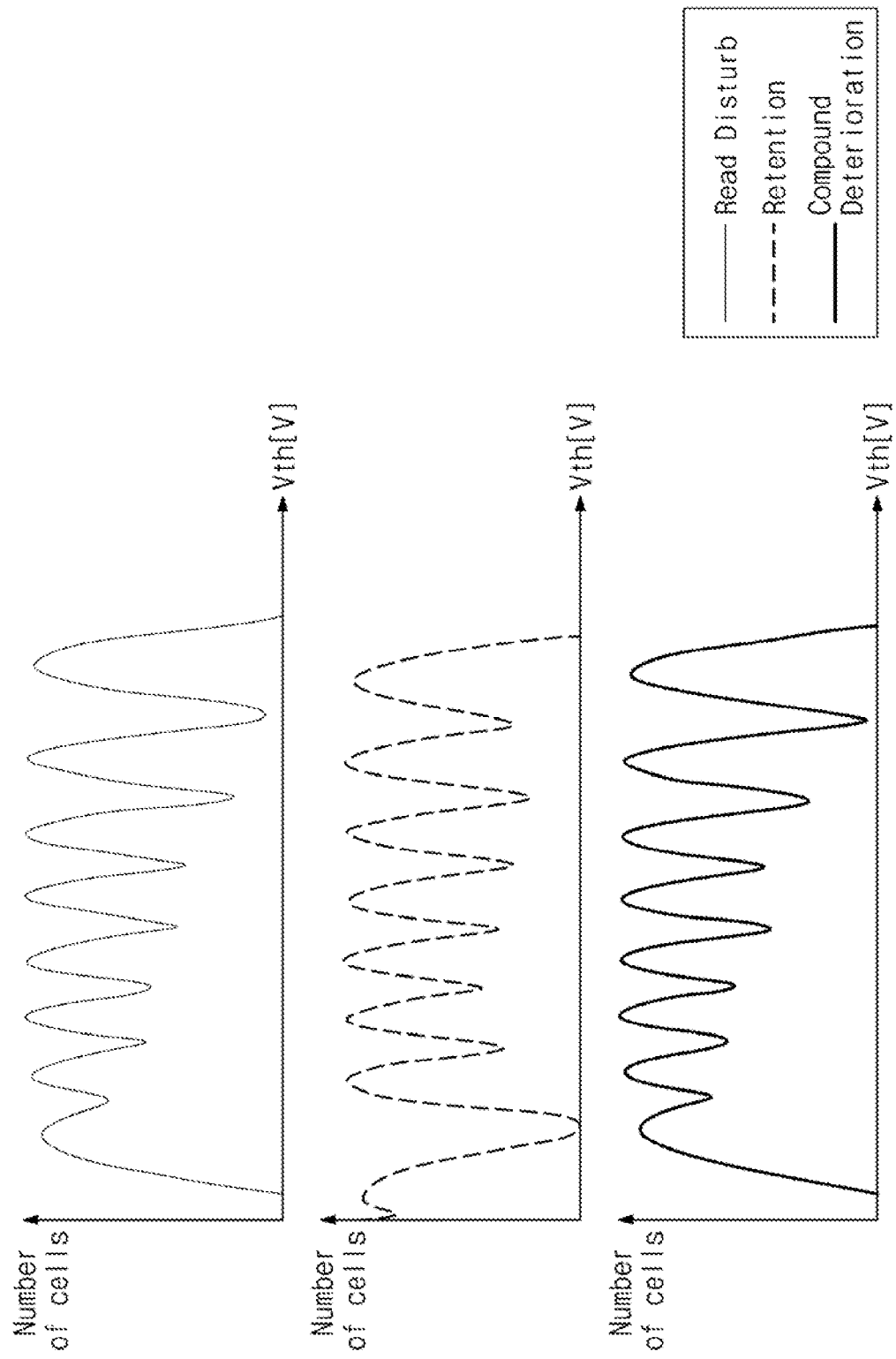
FIG. 10 is a diagram describing a compound deterioration distribution according to some example embodiments.

FIG. 10 is a diagram describing a compound deterioration distribution according to some example embodiments.

A graph of a read disturb type, a graph of a retention type, and a graph of a compound deterioration distribution will be described with reference to FIG. 10. In FIG. 10, a horizontal axis represents a threshold voltage, and a vertical axis represents the number of memory cells. A solid line indicates the read disturb type. A dashed line indicates the retention type. A bold solid line indicates the compound deterioration distribution.

Threshold voltage distributions of a memory region in a non-volatile memory device may change due to various factors. For example, the memory region may have a distribution of the retention type as a time passes from a programming point in time. Alternatively, the memory region may have a distribution of the read disturb type due to the read operation performed on the adjacent word line. However, the above factors may multiply occur, and thus, the memory region may have the compound deterioration distribution as a time passes from a programming point in time and as the read operation is performed on the adjacent word line.

In general, for the memory region having the compound deterioration distribution, it may be difficult to determine whether to perform the read reclaim operation. In detail, a general read reclaim device may obtain error count data of a page unit based on the read operation and error correction, and may determine whether to perform the read reclaim operation based on the error count data of the page unit. However, in the case where the number of memory cells whose bit values are flipped from "1" to "0" as a time passes increases and the number of memory cells whose bit values are flipped from "0" to "1" due to the read operation of the adjacent word line increases (i.e., in the case of the compound deterioration), because error memory cells may cancel each other out in the page unit, the general read reclaim device may determine that the read reclaim is not called for even though the compound deterioration factor occurs.

In contrast, a storage controller according to an example embodiment may determine whether the read reclaim is called for based on error count data of a read voltage unit, not the page unit. As such, it may be possible to accurately determine whether to perform the read reclaim operation on the memory region having the compound deterioration distribution in which the read disturb and the retention simultaneously occur.

Figure 11:
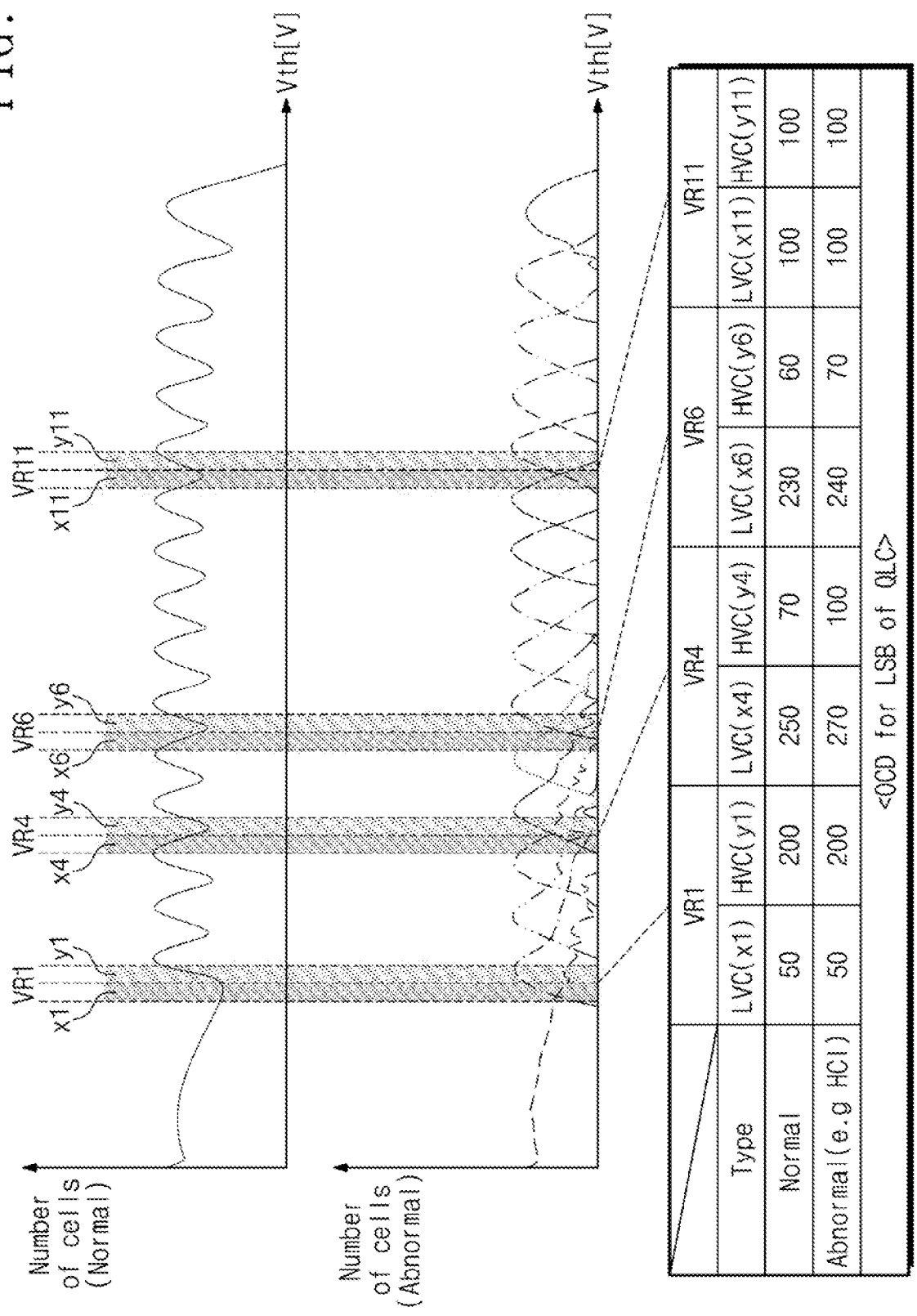
FIG. 11 is a diagram describing an abnormal distribution according to some example embodiments.

FIG. 11 is a diagram describing an abnormal distribution according to some example embodiments.

A normal type graph and an abnormal distribution graph, which are associated with the case of reading the least significant bit LSB of the quadruple level cell QLC, will be described with reference to FIG. 11. In the normal type graph and the abnormal distribution graph, a horizontal axis represents a threshold voltage, and a vertical axis represents the number of memory cells.

The abnormal distribution may indicate a distribution that is difficult to determine the degree of deterioration based on error memory cells of a page unit. For example, the abnormal distribution may include the HCI type.

The first, fourth, sixth, and eleventh read voltages VR1, VR4, VR6, and VR11 may correspond to a logical page of the least significant bit LSB of the quadruple level cell QLC.

Referring to the normal type graph, a solid line indicates a normal type waveform. In the OVS count data OCD of the normal type, "x1", "y1", "x4", "y4", "x6", "y6", "x11", and "y11" may be "50", "200", "250", "70", "230", "60", "100", and "100", respectively.

Referring to the abnormal distribution (e.g., HCI type) graph, abnormal distribution waveforms are illustrated by different types of lines depending on states of memory cells (e.g., an erase state, and first to fifteenth programming states). The whole waveform of the abnormal distribution may correspond to a sum of the illustrated waveforms. In the OVS count data OCD of the abnormal distribution, "x1", "y1", "x4", "y4", "x6", "y6", "x11", and "y11" may be "50", "200", "270", "100", "240", "70", "100", and "100", respectively.

That both "x4" and "y4" increase may be understood from a result of comparing the OVS count data OCD of the abnormal distribution and the OVS count data OCD of the normal type. Also, both "x6" and "y6" may increase. That is, both the number of memory cells whose bit values are flipped from "1" to "0" and the number of memory cells whose bit values are flipped from "0" to "1" may increase. It may be difficult to check this distribution change from the error count data of the page unit, and thus a general read reclaim device may fail to accurately determine whether the read reclaim for the memory region having the abnormal distribution is called for.

In contrast, the storage controller according to an example embodiment may determine whether the read reclaim is called for based on error count data of a read voltage unit, not the page unit. As such, it may be possible to accurately determine whether the read reclaim for the memory region having the abnormal distribution is called for.

Figure 12:
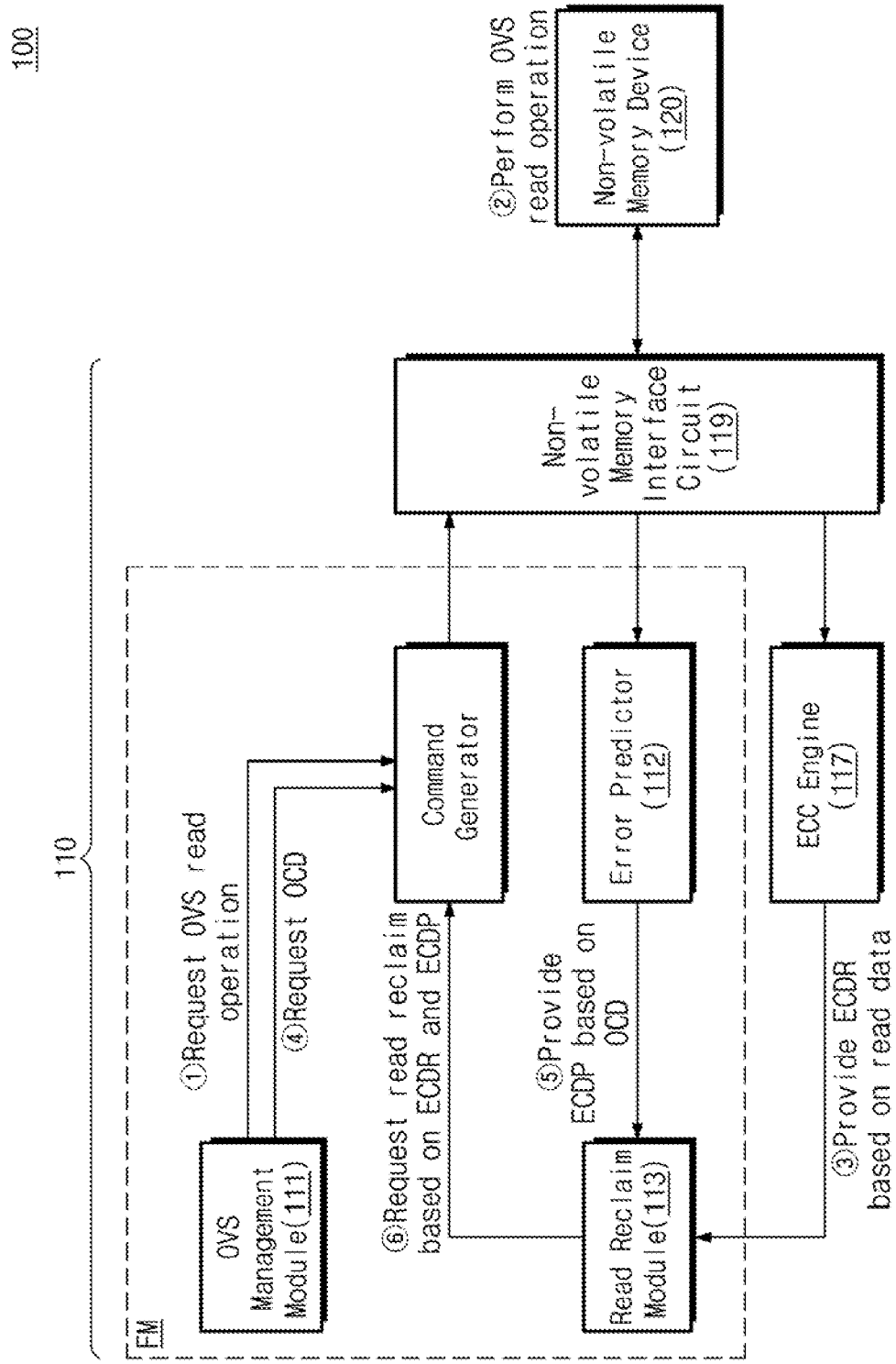
FIG. 12 is a diagram describing an operating method of a storage device according to some example embodiments.

FIG. 12 is a diagram describing an operating method of a storage device according to some example embodiments.

Referring to FIG. 12, the storage device 100 may include the storage controller 110 and the non-volatile memory device 120. The storage controller 110 may include the firmware memory FM, the ECC engine 117, and the non-volatile memory interface circuit 119. The firmware memory FM may include the OVS management module 111, the error predictor 112, the read reclaim module 113, and the command generator. The firmware memory FM, the non-volatile memory interface circuit 119, and the non-volatile memory device 120 are similar to the firmware memory FM, the non-volatile memory interface circuit 119, and the non-volatile memory device 120 of FIG. 6, and thus, additional description will be omitted to avoid redundancy. The ECC engine 117 is similar to the ECC engine 117 of FIG. 2, and thus, additional description will be omitted to avoid redundancy.

Below, an operating method of the storage device 100 according to some example embodiments will be described.

In a first operation ①, the OVS management module 111 may request the OVS read operation. The command generator may provide the command including the OVS read request to the non-volatile memory interface circuit 119 under control of the OVS management module 111. The non-volatile memory interface circuit 119 may provide the command including the OVS read request to the non-volatile memory device 120.

In a second operation ②, the non-volatile memory device 120 may perform the OVS read operation based on the command in the first operation ①. Based on the OVS read operation, the non-volatile memory device 120 may generate the OVS count data OCD and may provide the read data to the non-volatile memory interface circuit 119. The non-volatile memory interface circuit 119 may provide the read data to the ECC engine 117.

In a third operation ③, the ECC engine 117 may perform error correction on the read data. The ECC engine 117 may generate real error count data ECDR based on the error correction. The real error count data ECDR may indicate the number of memory cells in which an error is corrected by the ECC engine 117 (i.e., the number of memory cells whose bit values are corrected). The real error count data ECDR may include an error count value of a page unit.

In a fourth operation ④, the OVS management module 111 may request the OVS count data OCD. The command generator may provide the command including the request for the OVS count data OCD to the non-volatile memory interface circuit 119 under control of the OVS management module 111. The non-volatile memory interface circuit 119 may provide the command including the request for the OVS count data OCD to the non-volatile memory device 120. The non-volatile memory device 120 may provide the OVS count data OCD to the non-volatile memory interface circuit 119. The non-volatile memory interface circuit 119 may provide the OVS count data OCD to the error predictor 112.

In a fifth operation ⑤, the error predictor 112 may generate prediction error count data ECDP based on the OVS count data OCD. The prediction error count data ECDP may include a prediction error count value of a read voltage unit.

In a sixth operation ⑥, the read reclaim module 113 may determine whether to perform the read reclaim operation on the memory region based on the real error count data ECDR and the prediction error count data ECDP. When it is determined that the read reclaim is called for, the read reclaim module 113 may provide the read reclaim request to the command generator.

When a difference between error count values predicted in units of read voltage is great, because the probability that the memory region has the compound deterioration distribution or the abnormal distribution is high, the prediction error count data ECDP having error count values for each read voltage may be accurate. In contrast, when a difference between error count values predicted in units of read voltage is small, because the probability that the memory region has the normal distribution is high, the real error count data ECDR being a result of counting memory cells based on the error correction may be accurate.

The read reclaim module 113 may select one of the real error count data ECDR and the prediction error count data ECDP, based on whether the difference between error count values predicted in units of read voltage is greater than a reference deviation value.

For example, the prediction error count data ECDP may include a first prediction error count value for a first read voltage and a second prediction error count value for a second read voltage. When a difference between the first prediction error count value and the second prediction error count value is greater than the reference deviation value, the read reclaim module 113 may determine whether the read reclaim for the memory region is called for, based on the prediction error count data ECDP. When the difference between the first prediction error count value and the second prediction error count value is smaller than or equal to the reference deviation value, the read reclaim module 113 may determine whether the read reclaim for the memory region is called for, based on the real error count data ECDR.

Figure 13:
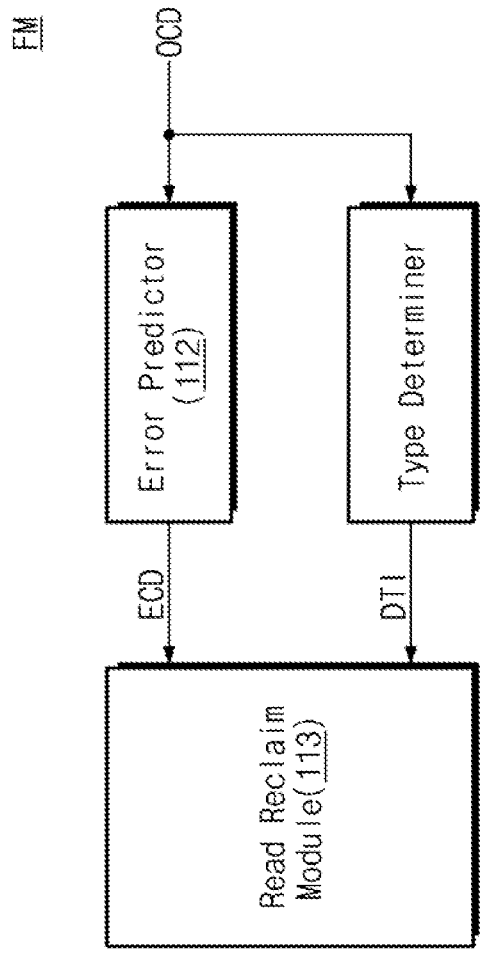
FIG. 13 is a diagram describing a type determiner according to some example embodiments.

FIG. 13 is a diagram describing a type determiner according to some example embodiments.

Referring to FIG. 13, the firmware memory FM may include the type determiner, the error predictor 112, and the read reclaim module 113. The firmware memory FM may correspond to the firmware memory FM of FIGS. 2 and 6. For better understanding, an example is illustrated as the firmware memory FM implements the type determiner, but the type determiner may be implemented with a separate hardware device.

The type determiner may generate distribution type information DTI based on the OVS count data OCD. The distribution type information DTI may indicate a predicted distribution type of a memory region. For example, because the OVS count data OCD include low area count values and high area count values associated with different read voltages, the OVS count data OCD may show the tendency of threshold voltage distributions of the memory region. The type determiner may predict a distribution type of the memory region as one of the pre-trained distribution types (e.g., the first to ninth distribution types of FIG. 9) based on multiple count values of the OVS count data OCD.

The error predictor 112 may generate the error count data ECD based on the OVS count data OCD.

The read reclaim module 113 may determine whether to perform the read reclaim operation, based on the distribution type information DTI and the error count data ECD. For example, the read reclaim module 113 may determine whether a read reclaim condition of the memory region is satisfied, based on the error count values of the error count data ECD. When it is determined that the read reclaim condition is satisfied, the read reclaim module 113 may determine whether a predicted distribution type indicated by the distribution type information DTI is an exceptional distribution type. Even though the read reclaim condition is satisfied, when the predicted distribution type is determined to be the exceptional distribution type, the read reclaim module 113 may not perform the read reclaim operation. In other words, when it is determined that the read reclaim condition is satisfied and the predicted distribution type is not the exceptional distribution type, the read reclaim module 113 may perform the read reclaim operation.

The exceptional distribution type that does not accompany the read reclaim operation may be the pre-programming type. For example, according to the pre-programming type, as the programming operation of the quadruple level cell QLC is divided and performed, a threshold voltage distribution of the pre-programming type may be lower than that of the normal type. This low threshold voltage distribution may not be associated with the degradation of the memory region. Accordingly, when the distribution type of the memory region is predicted as the pre-programming type, even though an error count value of the error count data ECD is greater than a reference value, the read reclaim module 113 may not request the read reclaim for the memory region.

Figure 14:
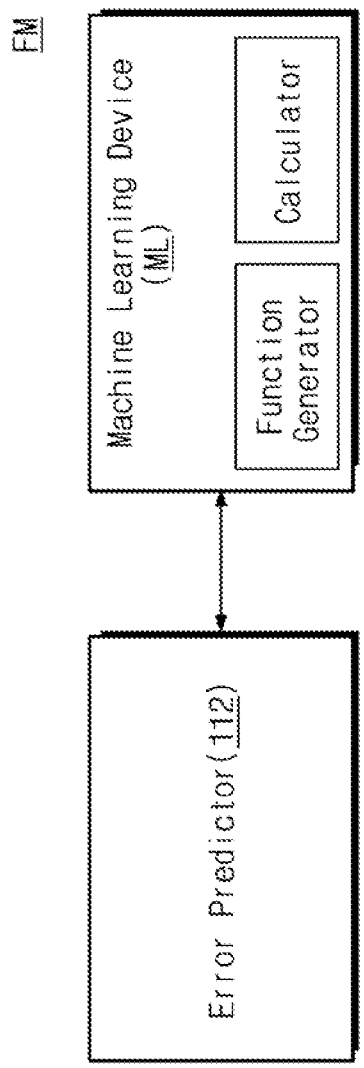
FIG. 14 is a diagram describing a machine learning device according to some example embodiments.

FIG. 14 is a diagram describing a machine learning device according to some example embodiments.

A machine learning device ML will be described with reference to FIG. 14. The firmware memory FM may include the error predictor 112 and the machine learning device ML. The firmware memory FM may correspond to the firmware memory FM of FIGS. 2 and 6. For better understanding, an example is illustrated in which the firmware memory FM implements the machine learning device ML, but the machine learning device ML may be implemented with a separate hardware device.

The machine learning device ML may assist an operation of generating the error count data ECD based on the OVS count data OCD. The machine learning device ML may include a function generator and a calculator.

The function generator may train for a correspondence relationship between the OVS count data OCD and the error count data ECD in a training step, and may generate a machine learning function. The machine learning function may indicate a correspondence relationship between an OVS count value and an error count value for each of different read voltages.

The calculator may generate the error count data ECD based on the machine learning function and the OVS count data OCD. The error count data ECD may include error count values predicted with respect to different read voltages.

Figure 15:
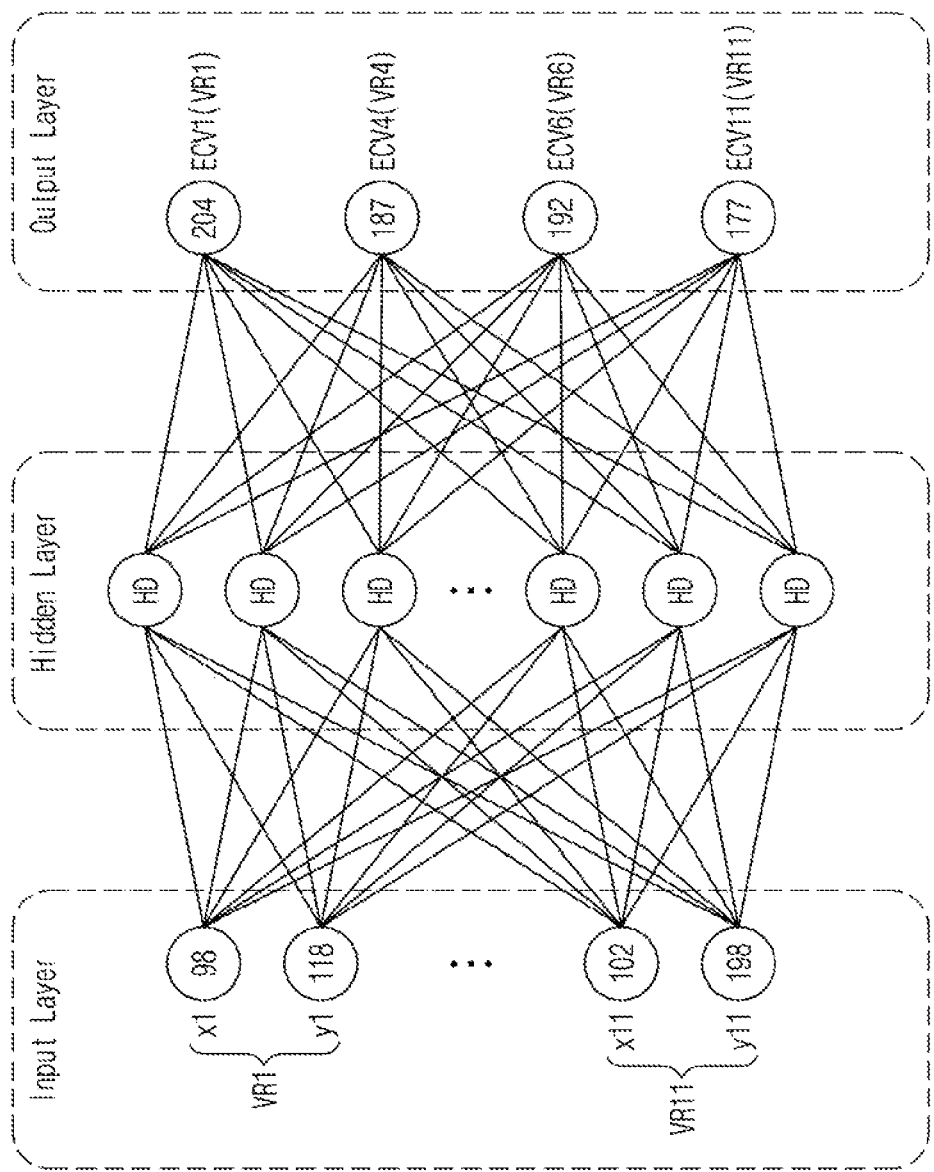
FIG. 15 is a diagram describing an operating method of a machine learning device of FIG. 14 according to some example embodiments.

FIG. 15 is a diagram describing an operating method of a machine learning device of FIG. 14 according to some example embodiments.

A machine learning function of the machine learning device ML of FIG. 14 will be described with reference to FIG. 15.

The machine learning function may include an input layer, a hidden layer, and an output layer. One hidden layer is illustrated for simplicity of drawing, but the number of hidden layers of the machine learning function may be increased.

The input layer may include a plurality of input data. The plurality of input data may correspond to count values of the OVS count data OCD.

For example, in the case of reading the least significant bit LSB of the quadruple level cell QLC, the OVS count data OCD may include a low area count (LAC) value and a high area count (HAC) value associated with each of the first, fourth, sixth, and eleventh voltages VR1, VR4, VR6, and VR11. The input layer may include the count values x1, y1, x4, y4, x6, y6, x11, and y11 associated with the first, fourth, sixth, and eleventh read voltages VR1, VR4, VR6, and VR11.

The hidden layer may include a plurality of hidden data. The hidden data may be obtained by calculating the plurality of input data and weights. For example, a weight may correspond to a solid line connecting layers in FIG. 15. The weight may be trained by a plurality of pairs of the OVS count data OCD and the error count data ECD in the training step of the machine learning device ML.

The output layer may include a plurality of output data. The plurality of output data may correspond to error count values of the error count data ECD. A value of output data may indicate the number of memory cells predicted with respect to the corresponding read voltage.

For example, in the case of reading the least significant bit LSB of the quadruple level cell QLC, the output layer may include first, fourth, sixth, and eleventh error count values ECV1, ECV4, ECV6, and ECV11 respectively corresponding to the first, fourth, sixth, and eleventh read voltages VR1, VR4, VR6, and VR11. The error count values described above may be used to determine whether to perform the read reclaim operation.

Figure 16:
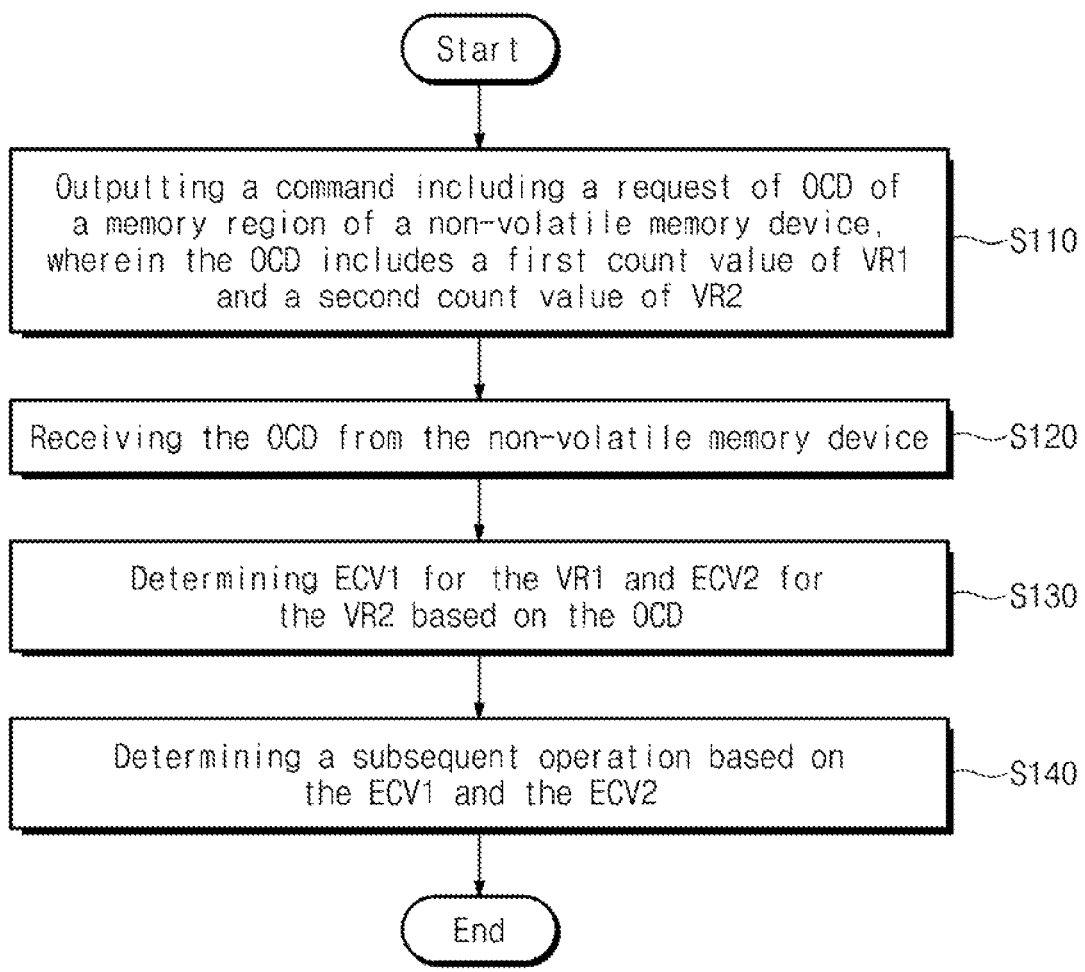
FIG. 16 is a flowchart describing an operating method of a storage controller according to some example embodiments.

FIG. 16 is a flowchart describing an operating method of a storage controller according to some example embodiments.

An operating method of the storage controller according to some example embodiments will be described with reference to FIG. 16. The storage controller may communicate with a non-volatile memory device. The storage controller may correspond to the storage controller 110 of FIGS. 1, 2, and 6.

In operation S110, the storage controller may provide the non-volatile memory device with a command including a request for the OVS count data OCD of a memory region in the non-volatile memory device. The OVS count data OCD may include a first count value of the first read voltage VR1 and a second count value of the second read voltage VR2.

The first read voltage and the second read voltage may correspond to the same logical page.

The first count value of the first read voltage VR1 may include a first low area count value and a first high area count value of the first read voltage VR1. The second count value of the second read voltage VR2 may include a second low area count value and a second high area count value of the second read voltage VR2.

In operation S120, the storage controller may receive the OVS count data OCD from the non-volatile memory device. The OVS count data OCD may be the OVS count data OCD requested in operation S110.

In operation S130, the storage controller may determine a first error count value ECV1 for the first read voltage VR1 and a second error count value ECV2 for the second read voltage VR2 based on the OVS count data OCD. That is, the storage controller may predict an error count value in units of read voltage, not page unit. The first error count value ECV1 and the second read voltage VR2 may be referred to as "error count data".

The storage controller may predict the first and second error count values ECV1 and ECV2 from the OVS count data OCD by using a machine learning device (e.g., the machine learning device ML of FIG. 14) in operation S130.

In operation S140, the storage controller may determine a subsequent operation based on the first and second error count values ECV1 and ECV2 determined in operation S130. The determination of the subsequent operation may mean determining an appropriate operation depending on whether the read reclaim is called for, regardless of whether the storage controller issues a command to the non-volatile memory device.

For example, when it is determined based on the first and second error count values ECV1 and ECV2 that the read reclaim is called for, the storage controller may output the command including the read reclaim request. For example, when it is determined based on the first and second error count values ECV1 and ECV2 that the read reclaim is not required, the storage controller may not perform an additional operation for the memory region until a separate read request is received from the host.

In some example embodiments, in operation S140, the storage controller may determine whether to perform the read reclaim operation, by comparing an error count value and a corresponding reference value.

For example, when the first error count value ECV1 is greater than a first reference value or the second error count value ECV2 is greater than a second reference value, the storage controller may output the command including the read reclaim request for the memory region to the non-volatile memory device.

For example, when the first error count value ECV1 is smaller than or equal to the first reference value or the second error count value ECV2 is smaller than or equal to the second reference value, the storage controller may not request read reclaim for the memory region.

Figure 17:
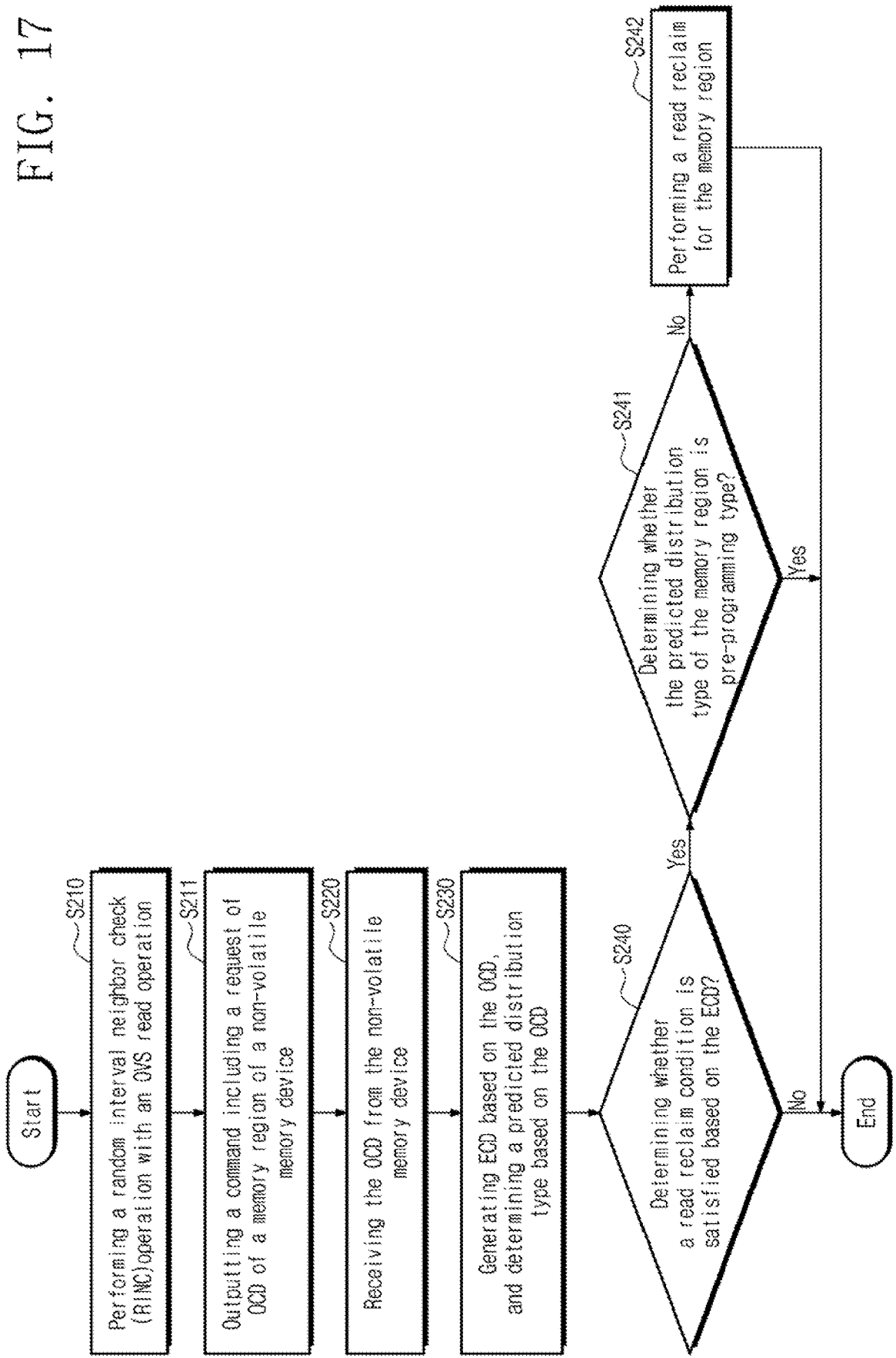
FIG. 17 is a flowchart describing an operating method of a storage controller according to some example embodiments.

FIG. 17 is a flowchart describing an operating method of a storage controller according to some example embodiments.

An operating method of the storage controller according to some example embodiments will be described with reference to FIG. 17. The storage controller may communicate with a non-volatile memory device. The storage controller may correspond to the storage controller 110 of FIGS. 1, 2, and 6.

In operation S210, the storage controller may perform a random interval neighbor check (RINC) operation. The RINC operation may refer to a read operation that the storage controller performs for reliability verification without intervention of the host after the read operation is performed as much as the reference number of times. The RINC operation may include the OVS read request.

In operation S211, the storage controller may output the command including a request for the OVS count data OCD of a memory region in the non-volatile memory device, based on the RINC operation in operation S210.

In operation S220, the storage controller may receive the OVS count data OCD from the non-volatile memory device.

In operation S230, the storage controller may generate the error count data ECD based on the OVS count data OCD. The storage controller may determine a predicted distribution type of the memory region based on the OVS count data OCD.

In operation S240, the storage controller may determine whether the read reclaim condition of the memory region is satisfied, based on the error count data ECD generated in operation S230.

For example, when error count values included in the error count data ECD are greater than reference values, the storage controller may determine that the read reclaim condition of the memory region is satisfied. In this case, the storage controller 110 may perform operation S241.

For example, when the error count values included in the error count data ECD are smaller than or equal to the reference values, the storage controller may determine that the read reclaim condition of the memory region is not satisfied. In this case, the operation may be terminated.

In operation S241, the storage controller may determine whether the predicted distribution type of the memory region is the pre-programming type. When it is determined that the predicted distribution type is the pre-programming type, the operation may be terminated. When it is determined that the predicted distribution type is not the pre-programming type, the storage controller may perform operation S242.

In operation S242, the storage controller may perform the read reclaim operation on the memory region. For example, the storage controller may output the command including the read reclaim request for the memory region to the non-volatile memory device.

Figure 18:
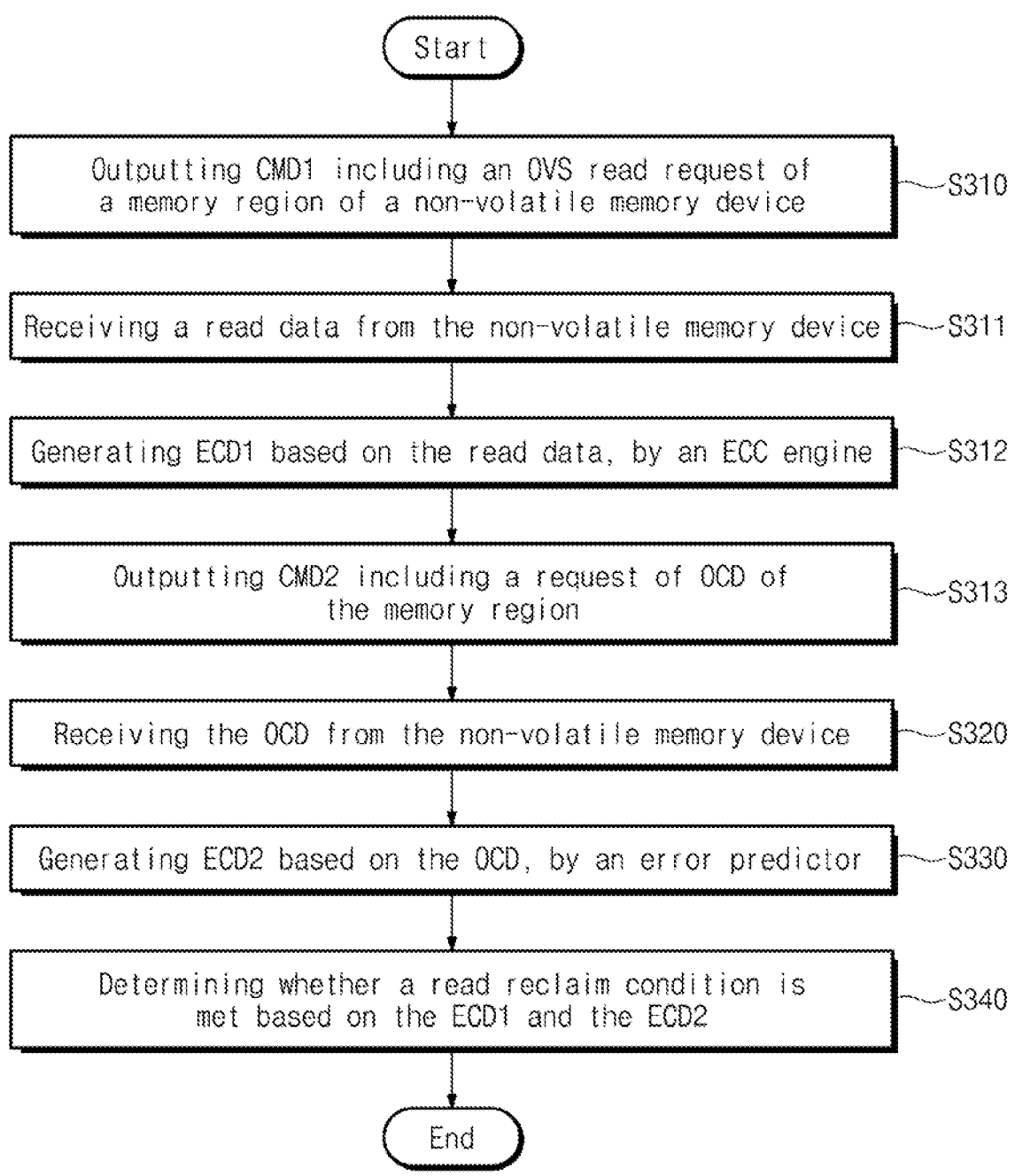
FIG. 18 is a flowchart describing an operating method of a storage controller according to some example embodiments.

FIG. 18 is a flowchart describing an operating method of a storage controller according to some example embodiments.

An operating method of the storage controller according to some example embodiments will be described with reference to FIG. 18. The storage controller may communicate with a non-volatile memory device. The storage controller may include an error predictor and an ECC engine. The storage controller may correspond to the storage controller 110 of FIGS. 1, 2, 6, and 12. The error predictor may correspond to the error predictor 112 described with reference to FIGS. 1, 2, 6, 12, 13, and 14. The ECC engine may correspond to the ECC engine 117 of FIGS. 2 and 12.

In operation S310, the storage controller may provide the non-volatile memory device with a first command CMD1 including the OVS read request for a memory region of the non-volatile memory device. The OVS read request may indicate an operation of reading data stored in the memory region and generating the OVS count data OCD corresponding to the read data.

In operation S311, the storage controller may receive the read data from the non-volatile memory device. The read data may be data read from the memory region of the non-volatile memory device depending on the OVS read request in operation S310.

In operation S312, the ECC engine of the storage controller may generate first error count data ECD1 based on the read data received in operation S311. The first error count data ECD1 may be real error count data generated by the error correction of the ECC engine. For example, the first error count data ECD1 may indicate the number of memory cells in which an error is corrected by the ECC engine in units of page.

In operation S313, the storage controller may provide the non-volatile memory device with a second command CMD2 including a request for the OVS count data OCD of the memory region. The OVS count data OCD may be generated by the non-volatile memory device depending on the OVS read request in operation S310.

In operation S320, the storage controller may receive the OVS count data OCD from the non-volatile memory device.

In operation S330, the error predictor of the storage controller may generate second error count data ECD2 based on the OVS count data OCD received in operation S320. The second error count data ECD2 may be error count data predicted from the OVS count data OCD based on the correspondence relationship pre-trained by the error predictor. The second error count data ECD2 may include error count values (e.g., an OVS count value including a low area count value and a high area count value) predicted for each of read voltages corresponding to the same logical page.

In operation S340, the storage controller may determine whether the read reclaim condition of the memory region is satisfied, based on the first error count data ECD1 and the second error count data ECD2.

In some example embodiments, in operation S340, the storage controller may select one of the first and second error count data ECD1 and ECD2, based on a difference between OVS count values (i.e., OVS count values predicted for each read voltage) included in the second error count data ECD2.

For example, the second error count data ECD2 may include a first error count value for a first read voltage and a second error count value for a second read voltage. When a difference between the first error count value and the second error count value is greater than the reference deviation value, the storage controller may determine whether the read reclaim condition is satisfied, based on the second error count data ECD2 generated by the error predictor. Alternatively, when the difference between the first error count value and the second error count value is smaller than or equal to the reference deviation value, the storage controller may determine whether the read reclaim condition is satisfied, based on the first error count data ECD1 generated by the error predictor.

Figure 19:
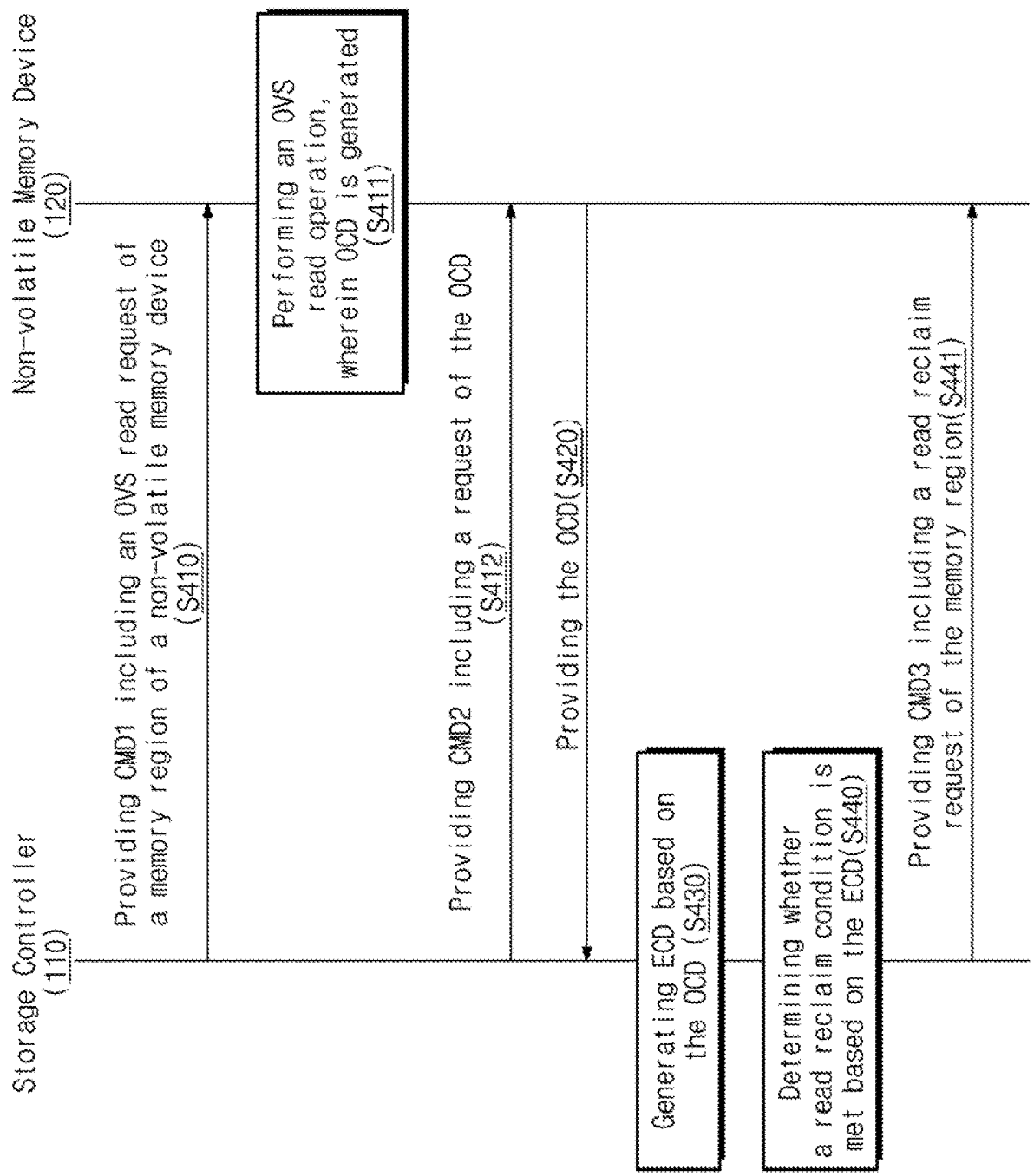
FIG. 19 is a flowchart describing an operating method of a storage device according to some example embodiments.

FIG. 19 is a flowchart describing an operating method of a storage device according to some example embodiments.

An operating method of a storage device according to example embodiments will be described with reference to FIG. 19. The storage device may include the storage controller 110 and the non-volatile memory device 120. The storage controller 110 may correspond to the storage controller 110 of FIGS. 1, 2, 6, and 12. The non-volatile memory device 120 may correspond to the non-volatile memory device 120 of FIGS. 1, 3, 6, and 12.

In operation S410, the storage controller 110 may provide the non-volatile memory device 120 with the first command CMD1 including the OVS read request for a memory region of the non-volatile memory device 120.

In operation S411, the non-volatile memory device 120 may perform the OVS read operation based on the first command CMD1. The non-volatile memory device 120 may generate the OVS count data OCD while performing the OVS read operation.

In operation S412, the storage controller 110 may provide the non-volatile memory device 120 with the second command CMD2 including a request for the OVS count data OCD.

In operation S420, the non-volatile memory device 120 may provide the OVS count data OCD to the storage controller 110 based on the second command CMD2 in operation S412.

In operation S430, the storage controller 110 may generate the error count data ECD based on the OVS count data OCD. The error count data ECD may be error count data predicted based on the OVS count data OCD and the pre-trained correspondence relationship. The error count data ECD may include error count value predicted in units of read voltage, not in units of page.

In operation S440, the storage controller 110 may determine whether the read reclaim condition of the memory region is satisfied, based on the error count data ECD. When it is determined that the read reclaim condition is satisfied, the storage controller 110 may perform operation S441.

In operation S441, the storage controller 110 may provide the non-volatile memory device 120 with a third command CMD3 including the read reclaim request for the memory region.

By way of summation and review, memory cells of the non-volatile memory device may have a programmed threshold voltage distribution corresponding to a bit value of data. A threshold voltage distribution may change due to various factors such as retention, read disturb, hot-carrier injection (HCI), and the like. The change in the threshold voltage distribution may cause the reduction of reliability of the non-volatile memory device. To prevent this issue, a read reclaim technique for copying data stored in a memory region of the non-volatile memory device to another memory region may be used. However, because the read reclaim increases a latency and an input/output (I/O) load, there is a need to carefully determine whether to perform a read reclaim operation.

As described above, embodiments may provide a storage controller determining an error count, a method of operating the same, and a method of operating a storage device including the same.

Also, a storage controller, in which a read reclaim condition is accurately determined, reliability is improved, and a latency and an I/O load decrease, by using an error count determined for each read voltage, using real error count data generated by an ECC engine together, considering an exceptional case based on a predicted distribution type, and using a machine learning device for the purpose of determining an error count, a method of operating the same, and a method of operating a storage device including the same are provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of operating a storage controller which communicates with a non-volatile memory device, the method comprising:
outputting a first command including a request for on-chip valley search (OVS) count data of a memory region of the non-volatile memory device to the non-volatile memory device, wherein the OVS count data include a first count value of a first read voltage and a second count value of a second read voltage;
receiving the OVS count data from the non-volatile memory device;
determining a first error count value for the first read voltage and a second error count value for the second read voltage, based on the OVS count data; and
determining a subsequent operation, based on the first and second error count values.

2. The method as claimed in claim 1, wherein the determining of the subsequent operation based on the first and second error count values includes outputting a second command including a read reclaim request for the memory region to the non-volatile memory device, when the first error count value is greater than a first reference value or the second error count value is greater than a second reference value.

3. The method as claimed in claim 1, further comprising:
outputting a third command including an OVS read request for the memory region to the non-volatile memory device, before outputting the first command,
wherein the OVS count data are generated by performing, at the non-volatile memory device, an OVS read operation on each of the first read voltage and the second read voltage.

4. The method as claimed in claim 3, further comprising:
receiving read data corresponding to the third command from the non-volatile memory device;
performing error correction of the read data, by an error correction code (ECC) engine of the storage controller; and
generating real error count data of the memory region, based on the error correction, and
wherein the determining of the subsequent operation based on the first and second error count values includes determining the subsequent operation based on the real error count data and the first and second error count values.

5. The method as claimed in claim 4, wherein the determining of the subsequent operation based on the real error count data and the first and second error count values includes:
when a difference between the first error count value and the second error count value is greater than a reference deviation value, determining the subsequent operation based on the first and second error count values; and
when the difference between the first error count value and the second error count value is smaller than or equal to the reference deviation value, determining the subsequent operation based on the real error count data.

6. The method as claimed in claim 1, wherein the determining of the first error count value for the first read voltage and the second error count value for the second read voltage based on the OVS count data includes:
applying the first count value of the OVS count data to a first function model to determine the first error count value; and
applying the second count value of the OVS count data to a second function model to determine the second error count value.

7. The method as claimed in claim 6, wherein the first function model includes information of a non-linear correspondence relationship between the first count value and the first error count value.

8. The method as claimed in claim 6, wherein the first function model includes information of a linear correspondence relationship between the first count value and the first error count value.

9. The method as claimed in claim 6, wherein the first function model is determined by a machine learning device of the storage controller based on a plurality of pairs of an OVS count value for the first read voltage and an error count value for the first read voltage, and
wherein the second function model is determined by the machine learning device of the storage controller based on a plurality of pairs of an OVS count value for the second read voltage and an error count value for the second read voltage.

10. The method as claimed in claim 1, wherein the determining of the first error count value for the first read voltage and the second error count value for the second read voltage based on the OVS count data includes determining a predicted distribution type of the memory region and the first and second error count values, based on the OVS count data, and
wherein the determining of the subsequent operation based on the first and second error count values includes determining the subsequent operation, based on the predicted distribution type and the first and second error count values.

11. The method as claimed in claim 10, wherein the determining of the subsequent operation based on the predicted distribution type and the first and second error count values includes:
   determining whether a read reclaim condition of the memory region is satisfied, based on the first and second error count values;
   when the read reclaim condition is satisfied, determining whether the predicted distribution type is a pre-programming type; and
   when the predicted distribution type is not the pre-programming type, outputting a second command including a read reclaim request of the memory region to the non-volatile memory device.

12. The method as claimed in claim 1, further comprising:
   starting a random interval neighbor check (RINC) operation before outputting the first command; and
   outputting a third command including an OVS read request for the memory region to the non-volatile memory device, based on the started RINC operation, before outputting the first command.

13. The method as claimed in claim 1, wherein the first count value includes:
   a first low area count value, which is a result of counting the number of memory cells included in a low area of the first read voltage from among a plurality of memory cells of the memory region; and
   a first high area count value, which is a result of counting the number of memory cells included in a high area of the first read voltage from among the plurality of memory cells of the memory region, and
   wherein the second count value includes:
   a second low area count value, which is a result of counting the number of memory cells included in a low area of the second read voltage from among the plurality of memory cells of the memory region; and
   a second high area count value, which is a result of counting the number of memory cells included in a high area of the second read voltage from among the plurality of memory cells of the memory region.

14. The method as claimed in claim 1, wherein the first read voltage and the second read voltage correspond to the same logical page.

15. The method as claimed in claim 1, wherein the memory region of the non-volatile memory device is implemented with a triple level cell (TLC) or a quadruple level cell (QLC), the OVS count data further include a third count value of a third read voltage, and the first to third read voltages correspond to the same logical page,
   wherein the determining of the first error count value for the first read voltage and the second error count value for the second read voltage based on the OVS count data includes determining the first error count value for the first read voltage, the second error count value for the second read voltage, and a third error count value for the third read voltage, based on the OVS count data, and
   wherein the determining of the subsequent operation based on the first and second error count values includes determining the subsequent operation based on the first to third error count values.

16. A method of operating a storage device which includes a non-volatile memory device and a storage controller, the method comprising:

providing, by the storage controller, a first command including an on-chip valley search (OVS) read request for a memory region of the non-volatile memory device to the non-volatile memory device;
generating, by the non-volatile memory device, OVS count data of the memory region based on the first command;
providing, by the storage controller, a second command including a request for the OVS count data to the non-volatile memory device;
providing, by the non-volatile memory device, the OVS count data to the storage controller based on the second command;
generating, by the storage controller, error count data of the memory region based on the OVS count data;
determining whether a read reclaim condition of the memory region is satisfied, based on the error count data; and
when the read reclaim condition is satisfied, outputting a third command including a read reclaim request of the memory region to the non-volatile memory device.

17. The method as claimed in claim 16, wherein the generating of the OVS count data of the memory region based on the first command by the non-volatile memory device includes generating, by the non-volatile memory device, the OVS count data including a first count value of a first read voltage and a second count value of a second read voltage, based on the first command,
   wherein the generating of the error count data of the memory region based on the OVS count data by the storage controller includes generating, by the storage controller, the error count data including a first error count value for the first read voltage and a second error count value for the second read voltage, based on the first and second count values of the OVS count data, and
   wherein the first read voltage and the second read voltage correspond to the same logical page.

18. A storage controller, comprising:
   an on-chip valley search (OVS) management module configured to manage an OVS read operation of a memory region of a non-volatile memory device;
   a command generator configured to generate a first command including an OVS read request and a second command including a request for OVS count data, under control of the OVS management module;
   an error predictor configured to generate error count data of the memory region based on the OVS count data received as a response of the second command from the non-volatile memory device; and
   a read reclaim module configured to determine whether a read reclaim condition of the memory region is satisfied, based on the error count data,
   wherein, when it is determined that the read reclaim condition is satisfied, the read reclaim module is further configured to generate a read reclaim request of the memory region, and
   wherein the command generator is further configured to generate a third command including the read reclaim request, under control of the read reclaim module.

19. The storage controller as claimed in claim 18, further comprising:
   an error correction code (ECC) engine configured to perform error correction based on read data received as a response of the first command from the non-volatile memory device and to generate real error count data of the memory region based on the error correction, wherein the read reclaim module is further configured to determine whether the read reclaim condition of the memory region is satisfied, based on the error count data and the real error count data.

20. The storage controller as claimed in claim 18, further comprising:
a type determiner configured to determine a predicted distribution type of the memory region based on the OVS count data received as a response of the second command from the non-volatile memory device,
wherein the read reclaim module is further configured to:
determine whether the predicted distribution type of the memory region is a pre-programming type, when it is determined that the read reclaim condition is satisfied; and
generate the read reclaim request of the memory region, when it is determined that the predicted distribution type of the memory region is not the pre-programming type.

* * * * *